US012772626B2

(12) United States Patent
Tae et al.

(10) Patent No.: US 12,772,626 B2
(45) Date of Patent: Oct. 20, 2026

(54) DISPLAY DEVICE AND METHOD OF MANUFACTURING THE SAME

(71) Applicant: Samsung Display Co., LTD., Yongin-si (KR)

(72) Inventors: Chang Il Tae, Yongin-si (KR); Tae Jin Kong, Yongin-si (KR); Sung Kook Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 460 days.

(21) Appl. No.: 18/345,555

(22) Filed: Jun. 30, 2023

(65) Prior Publication Data

US 2024/0006567 A1 Jan. 4, 2024

(30) Foreign Application Priority Data

Jul. 4, 2022 (KR) ........................ 10-2022-0082097

(51) Int. Cl.
*H01L 33/50* (2010.01)
*H10H 20/851* (2025.01)
(Continued)

(52) U.S. Cl.
CPC ...... *H10H 20/8514* (2025.01); *H10H 20/857* (2025.01); *H10W 90/00* (2026.01); *H10H 20/0361* (2025.01)

(58) Field of Classification Search
CPC .. H10H 20/8513; H10H 20/855; H10H 20/01; H10H 20/85; H10H 20/851;
(Continued)

(56) References Cited

U.S. PATENT DOCUMENTS 8,405,063 B2 3/2013 Kazlas et al.
12,063,817 B2 8/2024 Kim et al.
(Continued)

FOREIGN PATENT DOCUMENTS

KR 10-2022-0007775 1/2022
KR 10-2022-0016425 A 2/2022
(Continued)

OTHER PUBLICATIONS

Korean Notice of Allowance corresponding to KR Application No. 10-2022-0082097, dated Aug. 11, 2026 (6 pages).

*Primary Examiner* — Elmito Breval
(74) *Attorney, Agent, or Firm* — Womble Bond Dickinson (US) LLP

(57) ABSTRACT

A display device includes a substrate including a display area and a non-display area, a first pixel disposed at an outermost side of the display area of the substrate, a dummy pattern extending from the first pixel to the non-display area, and a signal pad disposed outside the dummy pattern and electrically connected to the first pixel. The first pixel includes a pixel circuit layer including a transistor disposed on the substrate, a display element layer disposed on the pixel circuit layer and including light emitting elements, and a first color conversion layer disposed on the display element layer. The dummy pattern is disposed on the pixel circuit layer in the non-display area adjacent to the first color conversion layer, and an upper surface of the dummy pattern is lower than an upper surface of the first color conversion layer.

11 Claims, 24 Drawing Sheets

(51) Int. Cl.

| | |
|---|---|
| ***H10H 20/857*** | (2025.01) |
| ***H10W 90/00*** | (2026.01) |
| *H10H 20/01* | (2025.01) |

(58) Field of Classification Search

CPC ............. H10H 29/142; H10H 20/8314; H10H 20/8506; G09F 9/33; G09F 9/335; H10K 59/12; H10K 59/1201; H10K 59/131; H10K 59/38; H10K 59/80; H10K 59/88; H10K 71/00; H10D 86/441

See application file for complete search history.

(56) References Cited

U.S. PATENT DOCUMENTS

| | | | | |
|---|---|---|---|---|
| 12,219,810 | B2 | 2/2025 | Choi et al. | |
| 2021/0111363 | A1* | 4/2021 | Hwang | H10K 59/38 |
| 2021/0143236 | A1* | 5/2021 | Kim | H10K 59/352 |

FOREIGN PATENT DOCUMENTS

| | | | |
|---|---|---|---|
| KR | 10-2022-0080801 | A | 6/2022 |
| KR | 10-2022-0087669 | A | 6/2022 |

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0082097 under 35 U.S.C. § 119, filed on Jul. 4, 2022 in the Korean Intellectual Property Office, the entire contents of which are herein incorporated by reference.

BACKGROUND

1. Technical Field

The disclosure relates to a display device and a method of manufacturing the display device.

2. Description of the Related Art

Recently, as interest in information display is increased, research and development of a display device are continuously being conducted.

SUMMARY

An aspect of the disclosure is to provide a display device including a non-emission area and a dummy pattern disposed in the non-display area in order to compensate (or alleviate) a step difference from a color conversion layer.

Another aspect of the disclosure is to provide a method of manufacturing the display device.

However, an aspect of the disclosure is not limited to the above-described aspects, and may be variously expanded without departing from the spirit and scope of the disclosure.

According to embodiments of the disclosure, a display device may include a substrate including a display area and a non-display area, a first pixel disposed at an outermost side of the display area of the substrate, a dummy pattern extending from the first pixel to the non-display area, and a signal pad disposed outside the dummy pattern and electrically connected to the first pixel. The first pixel may include a pixel circuit layer including a transistor disposed on the substrate, a display element layer disposed on the pixel circuit layer and including light emitting elements, and a first color conversion layer disposed on the display element layer. The dummy pattern may be disposed on the pixel circuit layer in the non-display area adjacent to the first color conversion layer, and an upper surface of the dummy pattern may be lower than an upper surface of the first color conversion layer.

According to an embodiment, the dummy pattern may have a plurality of step differences. The plurality of step differences may become lower in height toward an outside of the non-display area.

According to an embodiment, the dummy pattern may include an inorganic insulating material.

According to an embodiment, the dummy pattern may include a black material having a light blocking property.

According to an embodiment, the dummy pattern may include a first pattern layer disposed in the non-display area, and a second pattern layer disposed on at least a portion of an upper surface of the first pattern layer.

According to an embodiment, the dummy pattern may include a first pattern layer disposed in the non-display area, and a second pattern layer that is in physical contact with a side surface of the first pattern layer, and an upper surface of the first pattern layer may have a step difference from an upper surface of the second pattern layer.

According to an embodiment, the display device may further comprise a second pixel adjacent to the first pixel and including the pixel circuit layer, the display element layer, and a second color conversion layer on the display element layer, and a bank disposed between the first pixel and the second pixel.

According to an embodiment, the dummy pattern may be further disposed on the bank between the first pixel and the second pixel.

According to an embodiment, an upper surface of the bank may be lower than the upper surface of the first color conversion layer and an upper surface of the second color conversion layer.

According to an embodiment, an upper surface of the bank may be higher than the upper surface of the first color conversion layer and an upper surface of the second color conversion layer. The dummy pattern may have a plurality of step differences. The plurality of step differences may become lower in height toward an outside of the non-display area.

According to an embodiment, the display device may further comprise a capping layer integrally disposed on the first color conversion layer, the second color conversion layer, and the dummy pattern, a dummy bank overlapping the dummy pattern and disposed on the capping layer, a planarization layer integrally disposed on the capping layer and the dummy bank, a first color filter disposed on the planarization layer and overlapping the first color conversion layer, and a second color filter disposed on the planarization layer and overlapping the second color conversion layer.

According to an embodiment, each of the first pixel and the second pixel may include a first pixel electrode electrically connected to first ends of the light emitting elements, and a second pixel electrode electrically connected to second ends of the light emitting elements.

According to embodiments of the disclosure, a method of manufacturing a display device comprising a display area including pixels and a non-display area outside the display area may comprise forming a first color conversion layer in an emission area of a first pixel in which light emitting elements are disposed, forming a second color conversion layer in an emission area of a second pixel in which the light emitting elements are disposed, forming a dummy pattern in non-emission areas of the first pixel and the second pixel and in the non-display area extending from the first pixel, integrally forming a photoresist on the first color conversion layer, the second color conversion layer, and the dummy pattern, patterning the photoresist using a mask and etching a lower configuration exposed from the photoresist, removing a remaining photoresist, forming a dummy bank on the dummy pattern, and forming a planarization layer on the first color conversion layer, the second color conversion layer, and the dummy bank. The first pixel may be disposed at an outermost side of the display area, the second pixel may be adjacent to the first pixel, and an upper surface of the dummy pattern may be lower than an upper surface of the first color conversion layer and an upper surface of the second color conversion layer.

According to an embodiment, the dummy pattern may have a plurality of step differences. The plurality of step differences may become lower in height toward an outside of the non-display area.

According to an embodiment, the forming of the dummy pattern may include forming a first pattern layer in the non-display area and non-emission area, and forming a second pattern layer covering at least a portion of an upper surface of the first pattern layer.

According to an embodiment, the forming of the dummy pattern may include forming a first pattern layer on a via layer under the light emitting elements, and forming a second pattern layer that is in physical contact with a side of the first pattern layer in the non-display area, and an upper surface of the first pattern layer may have a step difference from an upper surface of the second pattern layer.

According to an embodiment, the dummy pattern may be formed by at least one of a chemical vapor deposition process using an inorganic material and a photoresist process using a black matrix.

According to an embodiment, the forming of the first color conversion layer may include applying a first color conversion material in the display area and the non-display area, removing the first color conversion material of a portion except for the emission area of the first pixel using a mask, and forming the first color conversion layer by thermally curing the first color conversion material remaining in the emission area of the first pixel.

According to an embodiment, the forming of the second color conversion layer may include applying a second color conversion material in the display area and the non-display area, removing the second color conversion material of a portion except for the emission area of the second pixel using a mask, and forming the second color conversion layer by thermally curing the second color conversion material remaining in the emission area of the second pixel.

According to an embodiment, the method may further comprise forming a first color filter overlapping the first color conversion layer and a second color filter overlapping the second color conversion layer on the planarization layer.

A display device and a method of manufacturing the same according to embodiments of the disclosure may include a dummy pattern surrounding a side surface of a color conversion layer formed higher than a bank. A portion of the dummy pattern extending to a non-display area may have a step shape that is lowered (becomes lower in height) toward an outside of the non-display area. Therefore, damage to the color conversion layer, which is generated because a photoresist for an etching process after formation of the color conversion layer is not coated on a portion of the side surface of the color conversion layer, may be prevented or minimized, and thus a defect rate may be improved.

Since a thickness of the photoresist may be maintained as thin as about 2.0 μm or less by disposition of the dummy pattern, a process deviation, a process time, and a cost may be reduced.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings.

DETAILED DESCRIPTION OF THE EMBODIMENTS

Figure 1:
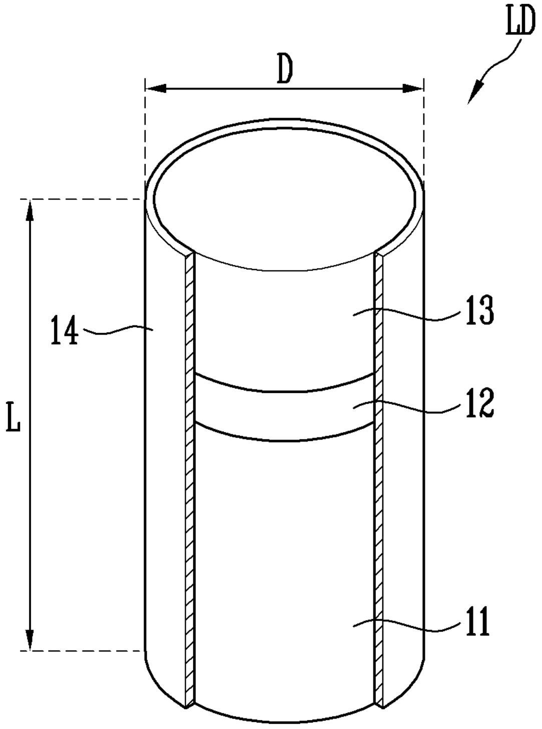
FIG. 1 is a schematic perspective view illustrating a light emitting element according to embodiments of the disclosure.

Hereinafter, embodiments of the disclosure are described in more detail with reference to the accompanying drawings. The same reference numerals are used for the same components in the drawings, and a repeated description of the same components is omitted.

Since embodiments described in the specification are only for clearly describing the spirit of the disclosure to those skilled in the art to which the disclosure pertains, the disclosure is not limited by embodiments described in the specification, and the scope of the disclosure should be interpreted as including modifications or variations that do not depart from the spirit of the disclosure.

The drawings included with the specification are intended to clearly describe the disclosure. Since the shape shown in the drawings may be exaggerated and displayed as necessary to help understanding of the disclosure, the disclosure is not limited by the drawings.

In the specification, when it is determined that detailed description of a configuration or function related to the disclosure may obscure the subject matter of the disclosure, detailed description thereof will be omitted as necessary.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that the terms "connected to," "coupled to," "contacts," and the like may include a physical and/or electrical connection, coupling, contact, or the like.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
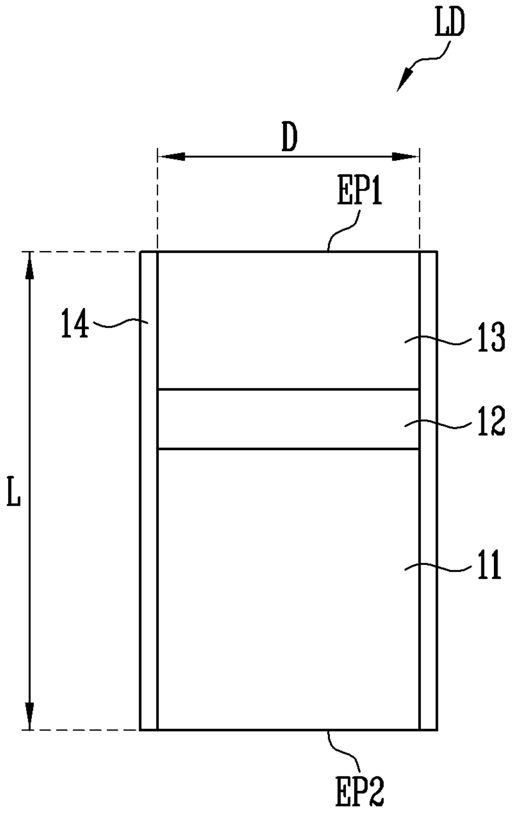
FIG. 2 is a schematic cross-sectional view illustrating an example of the light emitting element of FIG. 1.

FIG. 1 is a schematic perspective view illustrating a light emitting element LD according to embodiments of the disclosure, and FIG. 2 is a schematic cross-sectional view illustrating an example of the light emitting element LD of FIG. 1.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may be implemented in a light emitting stack (or a stack pattern) in which the first semiconductor layer 11, the active layer 12, and the second semiconductor layer 13 are sequentially stacked on each other.

The light emitting element LD may be provided in a shape extending in a direction. When an extension direction of the light emitting element LD is referred to as a length direction, the light emitting element LD may include a first end EP1 and a second end EP2 along the length direction. One semiconductor layer of the first semiconductor layer 11 and the second semiconductor layer 13 may be positioned at the first end EP1 of the light emitting element LD, and the other semiconductor layer of the first semiconductor layer 11 and the second semiconductor layer 13 may be positioned at the second end EP2 of the light emitting element LD.

The light emitting element LD may have various shapes. For example, as shown in FIG. 1, the light emitting element LD may have a rod-like shape, a bar-like shape, or a column shape that is long in the length direction (or having an aspect ratio greater than 1). In other embodiments, the light emitting element LD may have a rod-like shape, a bar-like shape, or a column shape that is short in the length direction (or having an aspect ratio of less than 1). In other embodiments, the light emitting element LD may have a rod-like shape, a bar-like shape, or a column shape having an aspect ratio of 1.

The light emitting element LD may include, for example, a light emitting diode (LED) manufactured to be extremely small to have a diameter D and/or a length L of about a nano scale (or nano meter) to a micro scale (or micro meter).

In case that the light emitting element LD is long in the length direction (for example, the aspect ratio is greater than 1), the diameter D of the light emitting element LD may be about 0.5 μm to about 6 μm, and the length L of the light emitting element LD may be about 1 μm to about 10 μm. However, the diameter D and the length L of the light emitting element LD are not limited thereto. A size of the light emitting element LD may be changed to satisfy a requirement condition (or a design condition) of a lighting device or a self-emission display device to which the light emitting element LD is applied.

The first semiconductor layer 11 may include, for example, at least one n-type semiconductor layer. The first semiconductor layer 11 may include an upper surface contacting the active layer 12 along the length direction of the light emitting element LD and a lower surface exposed to the outside. The lower surface of the first semiconductor layer 11 may be one end (or a lower end) of the light emitting element LD.

The active layer 12 (or an emission layer) may be disposed (or located) on the first semiconductor layer 11 and may be formed in a single or multiple quantum well structure. For example, in case that the active layer 12 is formed in the multiple quantum well structure, in the active layer 12, a barrier layer, a strain reinforcing layer, and a well layer may be periodically and repeatedly stacked on each other as one unit. The strain reinforcing layer may have a lattice constant less than that of the barrier layer to further reinforce a strain, for example, a compression strain, applied to the well layer. However, a structure of the active layer 12 is not limited to the above-described embodiment.

The active layer 12 may emit light of a wavelength of 400 nm to 900 nm, and may use a double hetero structure. The active layer 12 may include a first surface contacting the first semiconductor layer 11 and a second surface contacting the second semiconductor layer 13.

In an embodiment, a color (or an output light color) of the light emitting element LD may be determined according to the wavelength of the light emitted from the active layer 12. The color of the light emitting element LD may determine a color of a corresponding pixel. For example, the light emitting element LD may emit red light, green light, or blue light.

In case that an electric field of a predetermined or given voltage or more is applied to both ends of the light emitting element LD, the light emitting element LD may emit light while an electron-hole pair may be combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed (or located) on the second surface of the active layer 12 and may include a semiconductor layer of a type different from that of the first semiconductor layer 11.

The second semiconductor layer 13 may include a lower surface contacting the second surface of the active layer 12 along the length direction of the light emitting element LD and an upper surface exposed to the outside. Here, the upper surface of the second semiconductor layer 13 may be another end (or an upper end) of the light emitting element LD.

In an embodiment, the first semiconductor layer 11 and the second semiconductor layer 13 may have thicknesses different from each other in the length direction of the light emitting element LD. For example, the first semiconductor layer 11 may have a thickness relatively thicker than that of the second semiconductor layer 13 along the length direction of the light emitting element LD. Therefore, the active layer 12 of the light emitting element LD may be positioned more adjacently to the upper surface of the second semiconductor layer 13 than to the lower surface of the first semiconductor layer 11.

Although the first semiconductor layer 11 and the second semiconductor layer 13 are shown as being configured of one layer, the disclosure is not limited thereto. In an embodiment, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer for reducing a lattice constant difference. The TSBR layer may be configured of a p-type semiconductor layer such as p-GaInP, p-AlInP, and p-AlGaInP, but is not limited thereto.

According to an embodiment, the light emitting element LD may further include a contact electrode (hereinafter referred to as a "first contact electrode") disposed on the second semiconductor layer 13 in addition to the above-described first semiconductor layer 11, active layer 12, and second semiconductor layer 13. According to another embodiment, the light emitting element LD may further include another contact electrode (hereinafter referred to as a "second contact electrode") disposed at one end of the first semiconductor layer 11.

Each of the first and second contact electrodes may be an ohmic contact electrode, but embodiments are not limited thereto. According to an embodiment, the first and second contact electrodes may be schottky contact electrodes. The first and second contact electrodes may include a conductive material.

In an embodiment, the light emitting element LD may further include an insulating layer 14 (or an insulating film). However, according to an embodiment, the insulating layer 14 may be omitted and may be provided so as to cover only a portion of the first semiconductor layer 11, the active layer 12, and the second semiconductor layer 13.

The insulating layer 14 may prevent an electrical short that may occur in case that the active layer 12 contacts a conductive material other than the first and second semiconductor layers 11 and 13. The insulating layer 14 may minimize a surface defect of the light emitting element LD to improve life and light emission efficiency of the light emitting element LD. In case that the active layer 12 may prevent occurrence of a short with an external conductive material, presence or absence of the insulating layer 14 is not limited.

The insulating layer 14 may surround at least a portion an outer circumferential surface of the light emitting stack including the first semiconductor layer 11, the active layer 12, and the second semiconductor layer 13.

In the above-described embodiment, the insulating layer 14 may entirely surround the outer circumferential surface of each of the first semiconductor layer 11, the active layer 12, and the second semiconductor layer 13, but the disclosure is not limited thereto.

The insulating layer 14 may include a transparent insulating material. For example, the insulating layer 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide ($ZnO_x$), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the disclosure is not limited thereto, and various materials having insulating properties may be used as the material of the insulating layer 14.

The insulating layer 14 may be provided in a form of a single layer, or may be provided in a form of multiple layers including double layers.

The above-described light emitting element LD may be used as a light emitting source (or a light source) of various display devices. The light emitting element LD may be manufactured through a surface treatment process. For example, in case that multiple light emitting elements LD are mixed in a fluid solution (or solvent) and supplied to each pixel area (for example, an emission area of each pixel or an emission area of each sub-pixel), surface treatment may be performed on each of the light emitting elements LD so that the light emitting elements LD may be uniformly sprayed without being unevenly aggregated in the solution.

A light emitting unit (or a light emitting device) including the light emitting element LD described above may be used in various types of electronic devices that may require a light source, including a display device. For example, in case that multiple light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

However, this is an example, and the light emitting element LD applied to the display device according to embodiments of the disclosure is not limited thereto. For example, the light emitting element may be a flip chip type of micro light emitting diode or an organic light emitting element including an organic light emitting layer.

Figure 3:
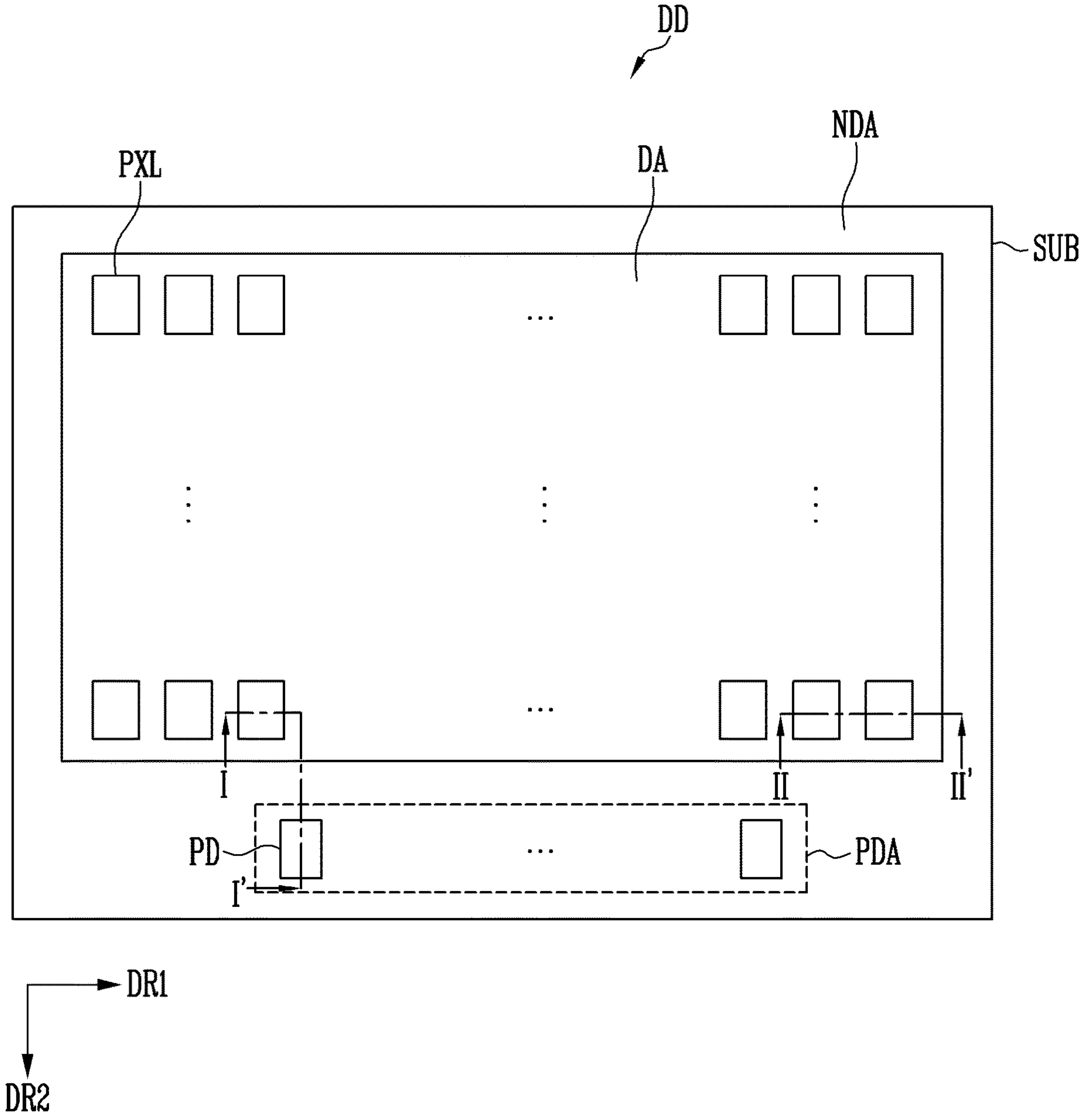
FIG. 3 is a schematic plan view illustrating a display device according to embodiments of the disclosure.

FIG. 3 is a schematic plan view illustrating a display device DD according to embodiments of the disclosure.

Referring to FIGS. 1, 2, and 3, the display device DD may include a substrate SUB and pixels PXL provided on the substrate SUB and including at least one light emitting element LD.

The substrate SUB may include a display area DA and a non-display area NDA.

The display area DA may be an area where the pixels PXL displaying an image are provided. The non-display area NDA may be an area in which a driver for driving the pixels PXL and a portion of a line unit electrically connecting the pixels PXL and the driver are provided.

The non-display area NDA may be positioned adjacent to the display area DA. The non-display area NDA may be provided at at least one side of the display area DA. For example, the non-display area NDA may surround a circumference (or an edge) of the display area DA.

In an embodiment, the non-display area NDA may include a pad area PDA. Signal pads PD may be disposed in the pad area PDA. The signal pad PD may supply (or transmit) a signal or power for driving the pixel PXL and/or the driver. For example, the signal pad PD may be electrically connected to a predetermined or given fan-out line, and may supply a predetermined or given signal to the pixel PXL corresponding thereto. According to an embodiment, the signal pad PD may be exposed to an outside and may be electrically connected to a predetermined or given driving circuit and/or driving chip through a separate connection member such as a conductive adhesive member.

In the display area DA, the pixels PXL may be arranged in a first direction DR1 (for example, a horizontal direction) and a second direction DR2 (for example, a vertical direction) crossing the first direction DR1.

The pixel PXL may include at least one light emitting element LD driven by a corresponding scan signal and data signal. The light emitting element LD may have a size as small as a nano scale (or nano meter) to a micro scale (or micro meter) and may be electrically connected in parallel with adjacently disposed light emitting elements, but the disclosure is not limited thereto.

Figure 4:
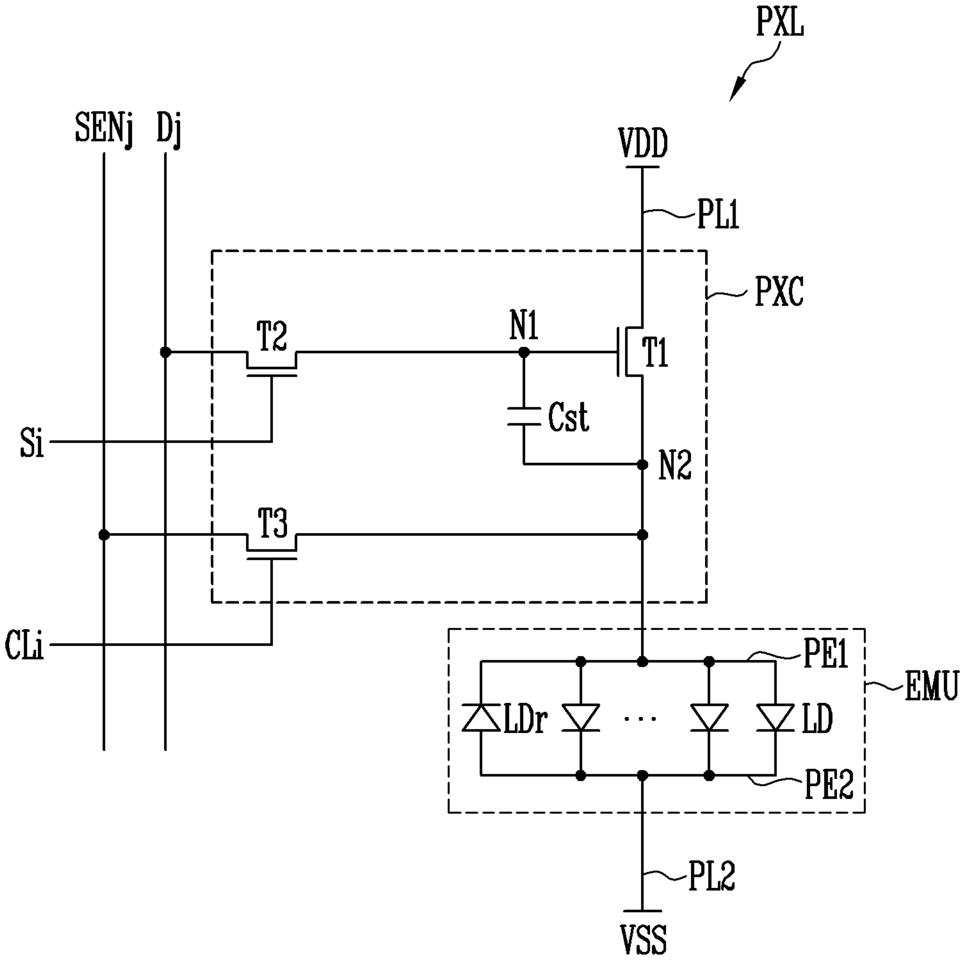
FIG. 4 is a schematic circuit diagram illustrating an example of a pixel included in the display device of FIG. 3.

FIG. 4 is a schematic circuit diagram illustrating an example of the pixel PXL included in the display device DD of FIG. 3.

Referring to FIGS. 1 to 4, the pixel PXL may include a pixel circuit PXC and an emission component EMU.

According to an embodiment, the emission component EMU may include multiple light emitting elements LD electrically connected in parallel between a first power line PL1 which is electrically connected to first driving power VDD and to which a voltage of the first driving power VDD is applied and a second power line PL2 which is electrically connected to second driving power VSS and to which a voltage of the second driving power VSS is applied. For example, the emission component EMU may include a first pixel electrode PE1 electrically connected to the first driving power VDD through the pixel circuit PXC and the first power line PL1, a second pixel electrode PE2 electrically connected to the second driving power VSS through the second power line PL2, and the light emitting elements LD electrically connected in parallel in the same direction between the first and second pixel electrodes PE1 and PE2. In an embodiment, the first pixel electrode PE1 may be an anode, and the second pixel electrode PE2 may be a cathode.

The first driving power VDD and the second driving power VSS may have different potentials. For example, the first driving power VDD may be set as high potential power, and the second driving power VSS may be set as low potential power. A potential difference between the first driving power VDD and the second driving power VSS may be set as a threshold voltage or more of the light emitting elements LD during an emission period of the pixel PXL.

Therefore, each of the light emitting elements LD electrically connected in parallel in the same direction (for example, a forward direction) between the first pixel electrode PE1 and the second pixel electrode PE2 may be an effective light source.

The light emitting elements LD of the emission component EMU may emit light with a luminance corresponding to a driving current supplied through a corresponding pixel circuit PXC. A driving current supplied to the emission component EMU may be divided and may flow to each of the light emitting elements LD. Accordingly, each of the light emitting elements LD may emit light with a luminance corresponding to the current flowing through the light emitting element LD, and thus the emission component EMU may emit light of the luminance corresponding to the driving current.

In an embodiment, the emission component EMU may further include at least one ineffective light source, for example, a reverse light emitting element LDr. The reverse light emitting element LDr may be electrically connected between the first and second pixel electrodes PE1 and PE2 in a direction opposite to the light emitting elements LD. The reverse light emitting element LDr may maintain an inactivated state even though a predetermined or given driving voltage (for example, a driving voltage of a forward direction) is applied between the first and second pixel electrodes PE1 and PE2, and thus a current may substantially not flow through the reverse light emitting element LDr.

In FIG. 4, the emission component EMU includes one series stage, but is not limited thereto, and the emission component EMU may have a form in which series stages defined by the light emitting elements LD electrically connected in parallel are connected in series.

The pixel circuit PXC may be electrically connected to a scan line Si (where i is a positive integer) and a data line Dj (where j is a positive integer) of the pixel PXL. The pixel circuit PXC may be electrically connected to a control line CLi and a sensing line SENj of the pixel PXL. For example, in case that the pixel PXL is disposed in an i-th row and a j-th column of the display area DA, the pixel circuit PXC of the pixel PXL may be electrically connected to an i-th scan line Si, a j-th data line Dj, an i-th control line CLi, and a j-th sensing line SENj.

In an embodiment, the pixel circuit PXC may include first to third transistors T1 to T3 and a storage capacitor Cst.

The first transistor T1 may be a driving transistor for controlling the driving current applied to the emission component EMU. The first transistor T1 may be electrically connected between the first driving power VDD and the emission component EMU. A gate electrode of the first transistor T1 may be electrically connected to a first node N1.

The first transistor T1 may control an amount of the driving current applied from the first driving power VDD to the emission component EMU through a second node N2, according to a voltage applied to the first node N1.

The second transistor T2 may be a switching transistor that selects the pixel PXL in response to a scan signal and activates the pixel PXL. The second transistor T2 may be electrically connected between the data line Dj and the first node N1. A gate electrode of the second transistor T2 may be electrically connected to the scan line Si.

The second transistor T2 may be turned on by the scan signal supplied to the scan line Si, and may transmit a data signal to the gate electrode of the first transistor T1.

The third transistor T3 may electrically connect the first transistor T1 to the sensing line SENj to obtain a sensing signal through the sensing line SENj, and detect a characteristic of the pixel PXL including a threshold voltage and the like of the first transistor T1 using the sensing signal. Information on the characteristic of the pixel PXL may be used to convert image data so that a characteristic deviation between the pixels PXL may be compensated.

The third transistor T3 may be electrically connected between the sensing line SENj and the second node N2. A gate electrode of the third transistor T3 may be electrically connected to the control line CLi.

In an embodiment, a voltage of initialization power may be provided through the sensing line SENj during a predetermined or given period. The third transistor T3 may be turned on in case that a sensing control signal is supplied from the control line CLi, to transmit the voltage of the initialization power to the second node N2. Accordingly, a voltage stored in the storage capacitor Cst electrically connected to the second node N2 may be initialized.

The storage capacitor Cst may be electrically connected between the first node N1 and the second node N2. The storage capacitor Cst may charge a data voltage corresponding to the data signal supplied to the first node N1 during one frame period. Accordingly, the storage capacitor Cst may store a voltage corresponding to a voltage difference between a voltage of the gate electrode of the first transistor T1 and a voltage of the second node N2.

In FIG. 4, an embodiment in which all of the first, second, and third transistors T1, T2, and T3 included in the pixel circuit PXC are N-type transistors is disclosed, but the disclosure is not limited thereto. For example, at least one of the above-described first, second, and third transistors T1, T2, and T3 may be changed to a P-type transistor. In FIG. 4, an embodiment in which the emission component EMU is electrically connected between the pixel circuit PXC and the second driving power VSS is disclosed, but the emission component EMU may be electrically connected between the first driving power VDD and the pixel circuit PXC.

The structure of the pixel circuit PXC may be variously changed and implemented. For example, the pixel circuit PXC may further include at least one transistor element such as a transistor for initializing the first node N1 and/or a transistor for controlling an emission time of the light emitting elements LD, or other circuit elements such as a boosting capacitor for boosting the voltage of the first node N1.

Figure 5:
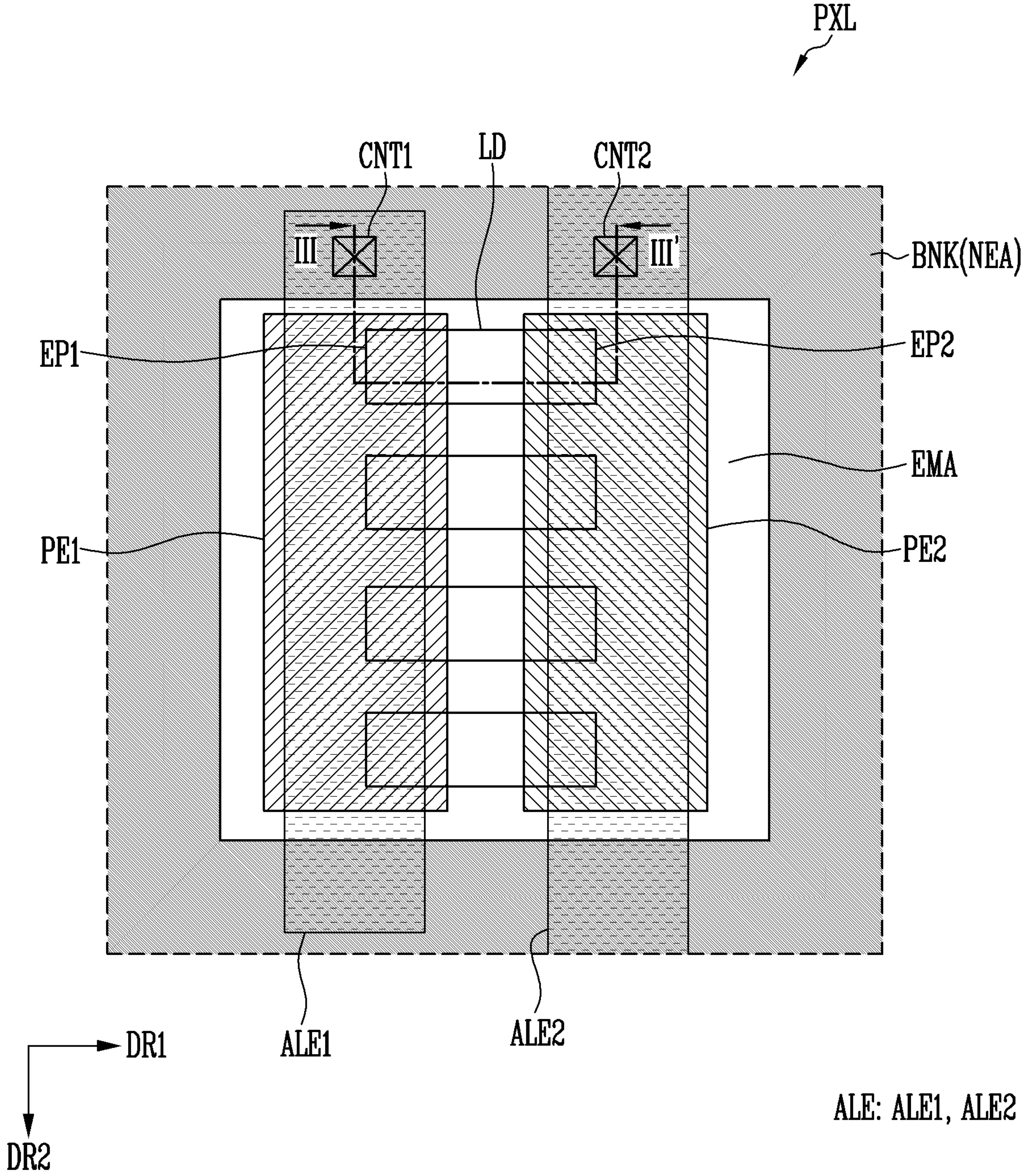
FIG. 5 is a schematic plan view illustrating an example of the pixel included in the display device of FIG. 3.

FIG. 5 is a schematic plan view illustrating an example of the pixel PXL included in the display device DD of FIG. 3.

Referring to FIGS. 3, 4, and 5, the pixel PXL (or a pixel area) may include an emission area EMA and a non-emission area NEA. The pixel PXL may include a first alignment electrode ALE1, a second alignment electrode ALE2, the light emitting elements LD, the first pixel electrode PE1, and the second pixel electrode PE2.

The light emitting elements LD may not be disposed in the non-emission area NEA. A portion of the non-emission area NEA may overlap a bank BNK when viewed in a plan view. For example, the bank BNK may define the emission area EMA and the non-emission area NEA. When viewed in a plan view, the bank BNK may overlap the non-emission area NEA. For example, the bank BNK may be a pixel defining layer or a dam structure that defines the emission area EMA to which the light emitting element LD is to be supplied in a process of supplying the light emitting element LD to the pixel PXL.

For example, the bank BNK may surround at least a portion of the emission area EMA.

Alignment electrodes ALE are electrodes for aligning the light emitting elements LD. The alignment electrode ALE may include the first alignment electrode ALE1 and the second alignment electrode ALE2.

The alignment electrode ALE may have a single layer or multiple layer of structure. For example, the alignment electrode ALE may include at least one layer of reflective electrode layer including a reflective conductive material, and may selectively further include at least one layer of transparent electrode layer and/or conductive capping layer. According to an embodiment, the alignment electrode ALE may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the disclosure is not limited to the above-described example, and the alignment electrode ALE may include at least one of various materials having a reflective property. However, the disclosure is not limited to the above-described example.

The light emitting elements LD may be disposed on the alignment electrode ALE. According to an embodiment, the light emitting elements LD may be disposed between the first alignment electrode ALE1 and the second alignment electrode ALE2. The light emitting elements LD may be aligned between the first alignment electrode ALE1 and the second alignment electrode ALE2.

According to an embodiment, the light emitting elements LD may be aligned in various methods. For example, FIG. 5 shows an embodiment in which the light emitting elements LD are aligned in parallel between the first alignment electrode ALE1 and the second alignment electrode ALE2. However, this is an example, and the light emitting elements LD may be aligned in series or in series/parallel mixed structure, and the number of units electrically connected in series and/or parallel is not particularly limited.

The first alignment electrode ALE1 and the second alignment electrode ALE2 may be spaced apart from each other. For example, the first alignment electrode ALE1 and the second alignment electrode ALE2 may be spaced apart from each other along the first direction DR1 in the emission area EMA, and each of the first alignment electrode ALE1 and the second alignment electrode ALE2 may extend along the second direction DR2.

The first alignment electrode ALE1 and the second alignment electrode ALE2 may be provided (or supplied) with a first alignment signal and a second alignment signal, respectively, in a process step in which the light emitting elements LD are aligned. For example, an ink including the light emitting elements LD may be supplied (or provided) to the emission area EMA defined by the bank BNK, the first alignment signal may be supplied to the first alignment electrode ALE1, and the second alignment signal may be supplied to the second alignment electrode ALE2. The light emitting elements LD may be aligned according to an electric field formed by the first alignment signal and the second alignment signal.

In an embodiment, the first alignment electrode ALE1 may be electrically connected to the first transistor T1 through a first contact hole CNT1.

In an embodiment, the second alignment electrode ALE2 may be electrically connected to a power line (for example, the second power line PL2 of FIG. 4) through a second contact hole CNT2.

A position of the first contact hole CNT1 and the second contact hole CNT2 is not limited to a position shown in FIG. 5 and may be variously changed appropriately.

The first end EP1 of the light emitting element LD may be adjacent to the first alignment electrode ALE1, and the second end EP2 of the light emitting element LD may be adjacent to the second alignment electrode ALE2.

According to an embodiment, the first end EP1 of each of the light emitting elements LD may be electrically connected to the first alignment electrode ALE1 through the first pixel electrode PE1. In another embodiment, the first end EP1 of each of the light emitting elements LD may be directly connected to the first alignment electrode ALE1.

Depending on embodiments, the first end EP1 of each of the light emitting elements LD may be electrically connected to only the first pixel electrode PE1 and may not be connected to the first alignment electrode ALE1. The first pixel electrode PE1 may be connected to the first transistor T1 thereunder through a predetermined or given contact hole while avoiding the first alignment electrode ALE1.

Similarly, the second end EP2 of each of the light emitting elements LD may be electrically connected to the second alignment electrode ALE2 and the second power line PL2 through the second pixel electrode PE2. In another embodiment, the second end EP2 of each of the light emitting elements LD may be directly connected to the second alignment electrode ALE2.

Depending on embodiments, the second end EP2 of each of the light emitting elements LD may be electrically connected to only the second pixel electrode PE2 and may not be connected to the second alignment electrode ALE2.

The first pixel electrode PE1 may be disposed on the first ends EP1 to be electrically connected to the first ends EP1 of the light emitting elements LD. In an embodiment, the first pixel electrode PE1 may be disposed on the first alignment electrode ALE1 to be electrically connected to the first alignment electrode ALE1.

The second pixel electrode PE2 may be disposed on the second ends EP2 to be electrically connected to the second ends EP2 of the light emitting elements LD. In an embodiment, the second pixel electrode PE2 may be disposed on the second alignment electrode ALE2 to be electrically connected to the second alignment electrode ALE2.

Figure 6:
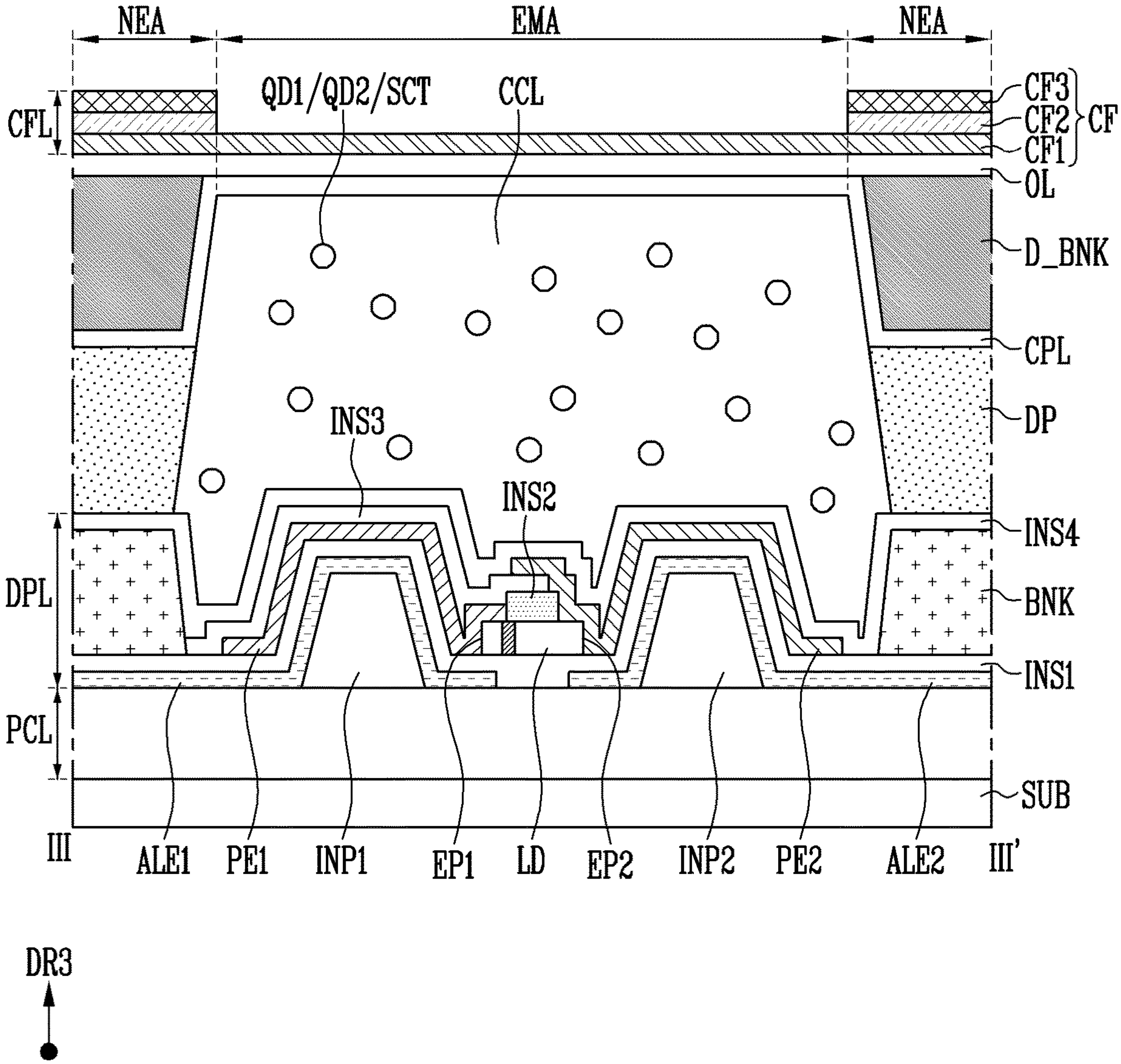
FIG. 6 is a schematic cross-sectional view illustrating an example taken along line III-III' of FIG. 5.
Figure 7:
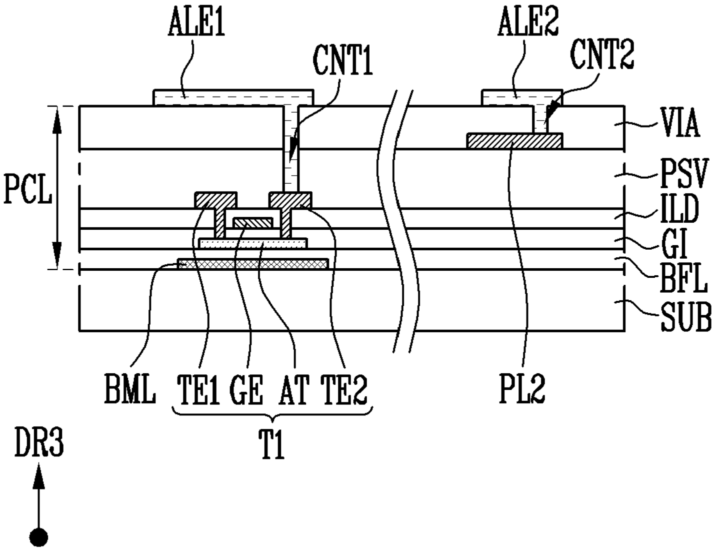
FIG. 7 is a schematic cross-sectional view illustrating an example of a pixel circuit layer of the pixel of FIG. 5.

FIG. 6 is a schematic cross-sectional view illustrating an example taken along line III-III' of FIG. 5, and FIG. 7 is a schematic cross-sectional view illustrating an example of the pixel circuit layer PCL of the pixel PXL of FIG. 5.

Referring to FIGS. 3, 4, 5, 6, and 7, the pixel PXL may include the substrate SUB, the pixel circuit layer PCL, the display element layer DPL, and a color filter layer CFL. In an embodiment, the pixel PXL may further include an optical layer between the display element layer DPL and the color filter layer CFL.

The substrate SUB may form a base member of the display device DD. The substrate SUB may be a rigid or flexible substrate or film. The substrate SUB may include a transparent insulating material to allow light to pass therethrough.

The substrate SUB may be a rigid substrate. For example, the rigid substrate may be at least one of a glass substrate, a quartz substrate, a glass ceramic substrate, and a crystalline glass substrate.

The substrate SUB may be a flexible substrate. The flexible substrate may be at least one of a film substrate and a plastic substrate including a polymer organic material. However, a material configuring the substrate SUB may be variously changed, and may include fiber reinforced plastic (FRP) or the like.

The pixel circuit layer PCL may be disposed on the substrate SUB. As shown in FIG. 7, the pixel circuit layer PCL may include a lower auxiliary electrode BML, a buffer layer BFL, a first transistor T1, a gate insulating layer GI, an interlayer insulating layer ILD, a passivation layer PSV, and a via layer VIA. In FIG. 7, only the first transistor T1 among circuit elements is shown for convenience of description.

The lower auxiliary electrode BML may be disposed on the substrate SUB. The lower auxiliary electrode BML may function as a path through which an electrical signal moves. According to an embodiment, a portion of the lower auxiliary electrode BML may overlap the first transistor T1 when viewed in a plan view.

The buffer layer BFL may be disposed on the substrate SUB. The buffer layer BFL may cover the lower auxiliary electrode BML. The buffer layer BFL may prevent an impurity from diffusing from the outside. The buffer layer BFL may include at least one of silicon oxide ($SiO_x$), silicon nitride ($SiN_x$), silicon oxynitride ($SiO_xN_y$), aluminum oxide ($AlO_x$), and titanium oxide ($TiO_x$).

The first transistor T1 may be electrically connected to light emitting elements LD. The first transistor T1 may include an active layer AT, a first transistor electrode TE1, a second transistor electrode TE2, and a gate electrode GE.

The active layer AT may mean a semiconductor layer. The active layer AT may be disposed on the buffer layer BFL. The active layer AT may include at least one of polysilicon, low temperature polycrystalline silicon (LTPS), amorphous silicon, and an oxide semiconductor.

The active layer AT may include a first contact area that is in contact with the first transistor electrode TE1 and a second contact area that is in contact with the second transistor electrode TE2. The first contact area and the second contact area may be semiconductor patterns doped with an impurity. An area between the first contact area and the second contact area may be a channel area. The channel area may be an intrinsic semiconductor pattern that is not doped with an impurity.

The gate electrode GE may be disposed on the gate insulating layer GI. The gate electrode GE may correspond to a position of the channel area of the active layer AT. For example, the gate electrode GE may be disposed on the channel area of the active layer AT with the gate insulating layer GI interposed therebetween.

The gate insulating layer GI may be disposed on the active layer AT. The gate insulating layer GI may include at least one of silicon oxide ($SiO_x$), silicon nitride ($SiN_x$), silicon oxynitride ($SiO_xN_y$), aluminum oxide ($AlO_x$), and titanium oxide ($TiO_x$).

The interlayer insulating layer ILD may be disposed on the gate electrode GE. The interlayer insulating layer ILD may include at least one of silicon oxide ($SiO_x$), silicon nitride ($SiN_x$), silicon oxynitride ($SiO_xN_y$), aluminum oxide ($AlO_x$), and titanium oxide ($TiO_x$).

The first transistor electrode TE1 and the second transistor electrode TE2 may be disposed on the interlayer insulating layer ILD. The first transistor electrode TE1 may pass through the gate insulating layer GI and the interlayer insulating layer ILD to contact the first contact area of the active layer AT, and the second transistor electrode TE2 may pass through the gate insulating layer GI and the interlayer insulating layer ILD to contact the second contact area of the active layer AT. For example, the first transistor electrode TE1 may be a drain electrode, and the second transistor electrode TE2 may be a source electrode, but are not limited thereto.

In an embodiment, the second transistor electrode TE2 may be electrically connected to the first alignment electrode ALE1 through a first contact hole CNT1 passing through the via layer VIA and the passivation layer PSV.

The passivation layer PSV may be disposed on the interlayer insulating layer ILD. The passivation layer PSV may include an organic material and/or an inorganic material. The passivation layer PSV may prevent diffusion of an impurity.

In an embodiment, a signal line such as the second power line PL2 may be disposed on the passivation layer PSV. However, this is an example, and the second power line PL2 may be disposed on the interlayer insulating layer ILD.

The via layer VIA covering the second power line PL2 may be disposed on the passivation layer PSV. The via layer VIA may be provided in a form including an organic insulating layer, an inorganic insulating layer, or an organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and a metal oxide such as aluminum oxide ($AlO_x$). The organic insulating layer may include, for example, at least one of acrylic resin (polyacrylates resin), epoxy resin, phenolic resin, polyamides resin, polyimide resin, unsaturated polyesters resin, poly-phenylene ethers resin, poly-phenylene sulfides resin, and benzocyclobutene resin.

In an embodiment, the second power line PL2 may be electrically connected to the second alignment electrode ALE2 through a second contact hole CNT2 passing through the via layer VIA.

The display element layer DPL may be disposed on the via layer VIA. The display element layer DPL may include a first insulating pattern INP1, a second insulating pattern INP2, the first alignment electrode ALE1, the second alignment electrode ALE2, the bank BNK, the light emitting element LD, the first pixel electrode PE1, the second pixel electrode PE2, a first insulating layer INS1, a second insulating layer INS2, a third insulating layer INS3, and a fourth insulating layer INS4.

The first insulating pattern INP1 and the second insulating pattern INP2 may be disposed on the via layer VIA. The first insulating pattern INP1 and the second insulating pattern INP2 may protrude in a thickness direction (for example, a third direction DR3) of the substrate SUB. The first insulating pattern INP1 and the second insulating pattern INP2 may include an organic material and/or an inorganic material.

The light emitting element LD may be disposed between the first insulating pattern INP1 and the second insulating pattern INP2. For example, the first and second insulating patterns INP1 and INP2 may define spaces in which the light emitting element LD is accommodated and arranged.

The first alignment electrode ALE1 and the second alignment electrode ALE2 may be disposed on the via layer VIA. A portion of the first alignment electrode ALE1 may be disposed on the first insulating pattern INP1, and a portion of the second alignment electrode ALE2 may be disposed on the second insulating pattern INP2. Each of the portion of the first alignment electrode ALE1 and the portion of the second alignment electrode ALE2 may function as a reflective partition wall or bank.

In an embodiment, the first alignment electrode ALE1 may be electrically connected to the first end EP1 of the light emitting element LD through the first pixel electrode PE1, and the second alignment electrode ALE2 may be electrically connected to the second end EP2 of the light emitting element LD through the second pixel electrode PE2. However, this is an example, and at least one of the first alignment electrode ALE1 and the second alignment electrode ALE2 may be electrically insulated from the light emitting element LD.

The first and second alignment electrodes ALE1 and ALE2 may include a conductive material. For example, the first and second alignment electrodes ALE1 and ALE2 may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the first and second alignment electrodes ALE1 and ALE2 are not limited to the above-described examples.

The first insulating layer INS1 may be disposed on the via layer VIA. The first insulating layer INS1 may cover the first and second alignment electrodes ALE1 and ALE2. The first insulating layer INS1 may stabilize a connection between electrode configurations and reduce an external influence. The first insulating layer INS1 may include at least one of silicon oxide ($SiO_x$), silicon nitride ($SiN_x$), silicon oxynitride ($SiO_xN_y$), aluminum oxide ($AlO_x$), and titanium oxide ($TiO_x$).

The bank BNK may be disposed on the first insulating layer INS1. The bank BNK may protrude in the thickness direction of the substrate SUB. The bank BNK may have a shape surrounding the emission area EMA. According to an embodiment, the bank BNK may include an organic material and/or an inorganic material. The bank BNK may correspond to the non-emission area NEA.

According to an embodiment, a thickness of the bank BNK may be about 1 μm. For example, the thickness of the bank BNK may be about ¼ or less of a thickness of the color conversion layer CCL.

The light emitting element LD may be disposed on the first insulating layer INS1. The light emitting element LD may overlap a portion of the first alignment electrode ALE1 and a portion of the second alignment electrode ALE2.

The second insulating layer INS2 may be disposed on the light emitting element LD. The second insulating layer INS2 may cover the active layer 12 of FIG. 1 of the light emitting element LD. The second insulating layer INS2 may prevent a short between adjacent electrodes (for example, the first pixel electrode PE1 and the second pixel electrode PE2). The second insulating layer INS2 may include an organic material or an inorganic material.

The first pixel electrode PE1 may contact the first end EP1 of the light emitting element LD and may be disposed on the first insulating layer INS1. The first pixel electrode PE1 may be an anode electrode electrically connected to the first transistor T1.

The third insulating layer INS3 may be disposed on the first pixel electrode PE1. The third insulating layer INS3 may prevent an electrical short between the first pixel electrode PE1 and the second pixel electrode PE2. The third insulating layer INS3 may include at least one material among silicon oxide ($SiO_x$), silicon nitride ($SiN_x$), silicon oxynitride ($SiO_xN_y$), aluminum oxide ($AlO_x$), and titanium oxide ($TiO_x$).

The second pixel electrode PE2 may electrically contact the second end EP2 of the light emitting element LD and may be disposed on the first insulating layer INS1, the second insulating layer INS2, and the third insulating layer INS3. The second pixel electrode PE2 may be a cathode electrode electrically connected to the second power line PL2.

As shown in FIG. 6, the first pixel electrode PE1 and the second pixel electrode PE2 may be disposed on different layers by different processes. However, this is an example, and the first pixel electrode PE1 and the second pixel electrode PE2 may be formed of the same material by the same process.

The first pixel electrode PE1 and the second pixel electrode PE2 may include a conductive material. For example, the first pixel electrode PE1 and the second pixel electrode PE2 may include a transparent conductive material including at least one of indium tin oxide (ITO), indium zinc oxide (IZO), and indium tin zinc oxide (ITZO). However, the disclosure is not necessarily limited to the above-described example.

The fourth insulating layer INS4 may be disposed on the third insulating layer INS3 and may cover the first pixel electrode PE1 and the second pixel electrode PE2. The fourth insulating layer INS4 may protect lower configurations of the display element layer DPL. In an embodiment, the fourth insulating layer INS4 may be integrally formed in the entire emission area EMA and non-emission area NEA. The fourth insulating layer INS4 may extend on the bank BNK.

The fourth insulating layer INS4 may include at least one material among silicon oxide ($SiO_x$), silicon nitride ($SiN_x$), silicon oxynitride ($SiO_xN_y$), aluminum oxide ($AlO_x$), and titanium oxide ($TiO_x$).

The color conversion layer CCL may be disposed on the fourth insulating layer INS4 in the emission area EMA. The color conversion layer CCL may change a wavelength of light provided from the light emitting element LD or transmit light provided from the light emitting element LD. In an embodiment, the light emitting element LD may emit blue light.

For example, in case that the pixel PXL is a red pixel, the color conversion layer CCL may include a first color conversion particle QD1. The first color conversion particle QD1 may convert the blue light into red light. The first color conversion particle QD1 (for example, a quantum dot) may absorb the blue light and shift a wavelength according to energy transition to emit the red light.

In case that the pixel PXL is a green pixel, the color conversion layer CCL may include a second color conversion particle QD2. The second color conversion particle QD2 may convert the blue light into green light. The second color conversion particle QD2 may absorb the blue light and shift a wavelength according to energy transition to emit the green light.

In case that the pixel PXL is blue pixel, the color conversion layer CCL may include a light scattering particle SCT and function as a light scattering layer. In another embodiment, in case that the pixel PXL is blue pixel, a transparent polymer may be provided instead of the color conversion layer CCL.

In an embodiment, the color conversion layer CCL may be formed through a process of etching and curing a color conversion material after coating the color conversion material on the entire display area DA. For example, the color conversion material may be patterned so that the color conversion layer CCL is formed only in the emission area EMA.

A thickness of the color conversion layer CCL may be about 4 μm or more. For example, the thickness of the color conversion layer CCL may be about 10 μm, and a step difference between the color conversion layer CCL and the bank BNK may be about 5 μm or more.

A dummy pattern DP may be disposed on the bank BNK in the non-emission area NEA. In an embodiment, the dummy pattern DP may be disposed on (e.g., directly disposed on) the fourth insulating layer INS4 on the bank BNK in the non-emission area NEA. However, this is an example, and in the non-emission area NEA from which the fourth insulating layer INS4 is removed, the dummy pattern DP may be disposed on (e.g., directly disposed on) the bank BNK.

In an embodiment, the dummy pattern DP may be a structure provided after the color conversion layer CCL is formed and may reduce (compensate, or alleviate) a step difference between the emission area EMA and the non-emission area NEA during a manufacturing process. For example, in a state in which the color conversion layer CCL and the dummy pattern DP are provided, a photoresist may be provided (applied, or coated) to the entire display device DD on the dummy pattern DP and the color conversion layer CCL for a patterning process for exposing the signal pad PD or the like of the pad area PDA of the non-display area NDA (for example, shown in FIGS. 20 and 21).

A thickness of the photoresist may be about 1.4 μm to about 2.0 μm, and in case that a step difference of an object to be applied is large, a portion where the photoresist is not applied (or coated) may be generated due to a high step difference and/or a sharp inclination. For example, in case that the dummy pattern DP for alleviating the step difference does not exist, the photoresist may not be applied to a portion of a side surface of the color conversion layer CCL. A portion of the color conversion layer CCL where the photoresist is not formed may be damaged such as being unintentionally removed or etched in a subsequent process, which may become a factor of a process defect.

In order to solve a problem that the photoresist is not coated on the color conversion layer CCL, a method of applying a thickness of the photoresist similarly to a thickness level of the color conversion layer CCL may be considered. However, as the thickness of the photoresist increases, a large amount of exposure light may be required for etching, which may cause problems of an increase of a process time and a cost. As the thickness of the photoresist increases, a problem that a residual photoresist remains after subsequent etching and stripping processes may occur.

In order to solve the above-described problems, the dummy pattern DP for alleviating a step difference between the color conversion layer CCL and an adjacent area may be disposed in the non-emission area NEA of the display area DA and the non-display area NDA. In an embodiment, an upper surface of the dummy pattern DP may be at a position lower than an upper surface of the color conversion layer CCL. For example, a thickness of the dummy pattern DP may be about 5 μm or less. However, this is an example, and the thickness of the dummy pattern DP is not limited thereto.

In an embodiment, the dummy pattern DP may include an inorganic insulating material. For example, the dummy pattern DP may include at least one material among silicon oxide ($SiO_x$), silicon nitride ($SiN_x$), silicon oxynitride ($SiO_xN_y$), aluminum oxide ($AlO_x$), and titanium oxide ($TiO_x$).

In an embodiment, the dummy pattern DP may include a reflective material and/or a black material having a light blocking property. The dummy pattern DP may prevent a light leakage defect in which light (or rays) leaks between the pixel PXL and the pixels PXL adjacent thereto. For example, the dummy pattern DP may be a black matrix. In other embodiments, the dummy pattern DP may include carbon black, but is not limited thereto. Accordingly, light output efficiency of the light emitting elements LD and the pixel PXL may be improved.

According to an embodiment, the dummy pattern DP may include multiple layers formed of a combination of the above-described materials or one material. For example, the dummy pattern DP may be formed through various materials and processes to alleviate a step difference between the color conversion layer CCL and an adjacent area (portion).

A capping layer CPL may be disposed on the color conversion layer CCL and the dummy pattern DP from which all of the above-described photoresist is removed. In an embodiment, the capping layer CPL may be provided over (or entirely in) the display area DA, and may be disposed on (e.g., directly disposed on) the dummy pattern DP and the color conversion layer CCL.

The capping layer CPL may be an inorganic layer (or an inorganic insulating layer) including an inorganic material. For example, the capping layer CPL may include at least one of silicon nitride ($SiN_x$), silicon oxide ($SiO_x$), silicon oxynitride ($SiO_xN_y$), and a metal oxide such as aluminum oxide ($AlO_x$). The capping layer CPL may protect the color conversion layer CCL by covering the color conversion layer CCL.

In an embodiment, a dummy bank D_BNK may be further disposed on the capping layer CPL of the non-emission area NEA. For example, an upper surface of the dummy bank D_BNK may have a height similar to that of the capping layer CPL or the color conversion layer CCL.

The dummy bank D_BNK may be configured to include at least one light blocking material and/or reflective material so as to allow the light emitted from the light emitting elements LD to further proceed in an image display direction (or the third direction DR3) of the display device DD, thereby improving light output efficiency of the light emitting element LD.

According to an embodiment, the dummy bank D_BNK may be omitted, and a corresponding portion may be filled with an organic layer OL, which is a planarization layer.

The organic layer OL may be disposed on the capping layer CPL and the dummy bank D_BNK. The organic layer OL may alleviate a step difference generated by components disposed thereunder, and may provide a flat surface thereon. For example, the organic layer OL may function as a planarization layer. The organic layer OL may be a common layer commonly provided to the display area DA, but is not limited thereto.

The organic layer may include an organic material such as acrylates resin, epoxy resin, phenolic resin, polyamides resin, polyimides resin, polyesters resin, polyphenylenesulfides resin, and/or benzocyclobutene (BCB) resin, but is not limited thereto.

The color filter layer CFL may be disposed on the organic layer OL. The color filter layer CFL may include color filters CF, the color filters CF include a first color filter CF1, a second color filter CF2, and a third color filter CF3.

The color filters CF may selectively transmit light of a specific color. The color filters CF may include a color filter material that selectively transmits light of a specific color converted by the color conversion layer CCL. The first color filter CF1 may overlap the emission area EMA of the pixel PXL emitting a first color. For example, a red color filter may be disposed to overlap the emission area EMA of a red pixel. As described above, the first color filter CF1, the second color filter CF2, and the third color filter CF3 may be a red color filter, a green color filter, and a blue color filter according to an emission color of the pixel PXL, respectively.

In an embodiment, the first, second, and third color filters CF1, CF2, and CF3 may be stacked on each other to overlap at least a portion of the non-emission area NEA. Therefore, a stack structure of the color filters CF in the non-emission area NEA may have a light blocking function and may serve to improve display quality.

Figure 8:
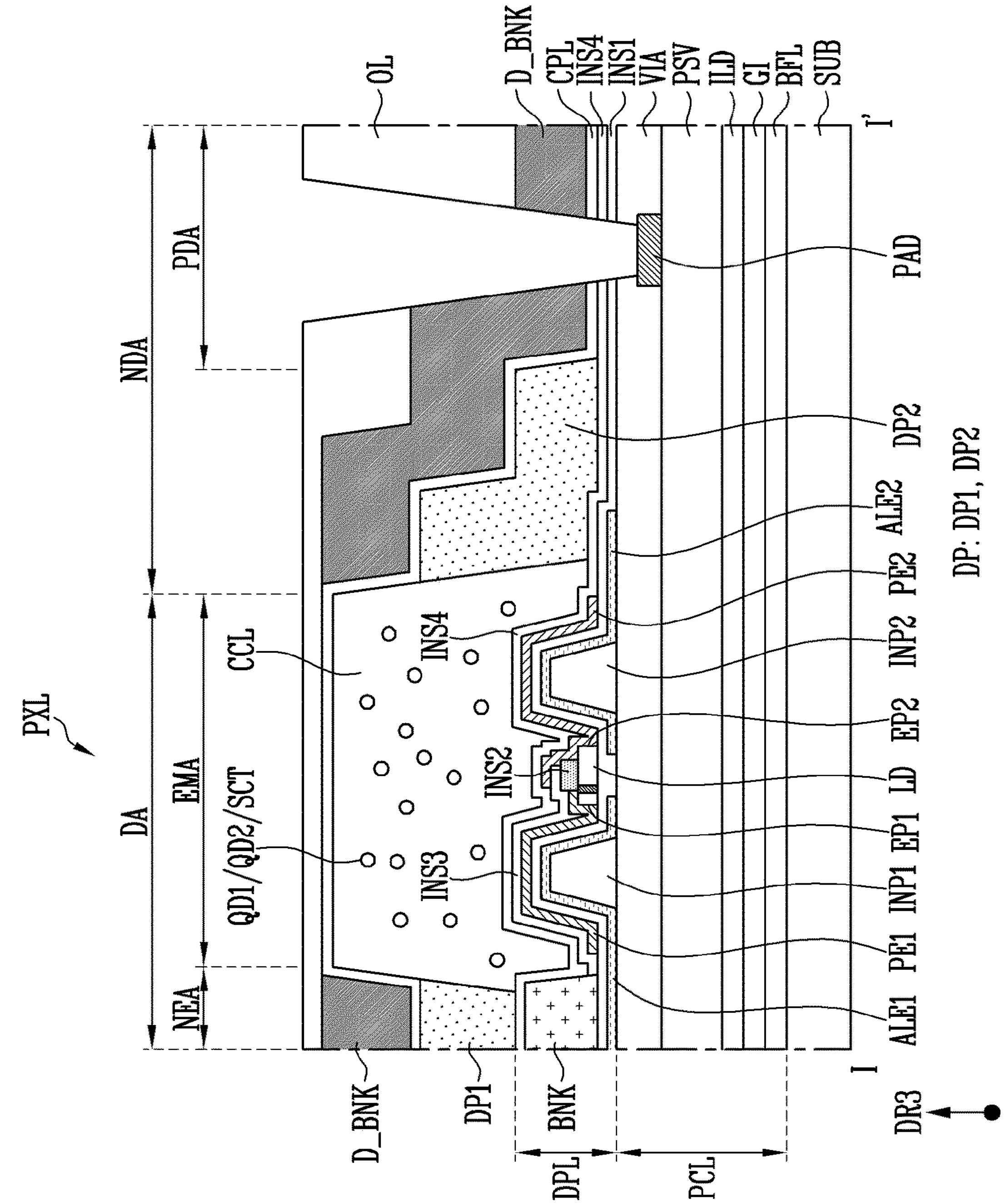
FIG. 8 is a schematic cross-sectional view illustrating an example taken along line I-I' of FIG. 3.

FIG. 8 is a schematic cross-sectional view illustrating an example taken along line I-I' of FIG. 3.

In FIG. 8, the same reference numerals are used for the same components as the components described with reference to FIGS. 6 and 7, and redundant description of these components is omitted.

Referring to FIGS. 3 and 8, the display device DD may include the display area DA in which the pixel PXL is disposed and the non-display area NDA outside the display area DA. The non-display area NDA may include the pad area PDA in which the signal pad PAD is disposed.

In an embodiment, the signal pad PAD may be formed in the pixel circuit layer PCL. For example, the signal pad PAD may be disposed on the passivation layer PSV. However, this is an example, and a position at which the signal pad PAD is disposed is not limited thereto.

The signal pad PAD may be electrically connected to the pixel PXL of the display area DA through a predetermined or given signal line. In an embodiment, as shown in FIG. 8, the signal pad PAD may be exposed from structures thereon. Therefore, the signal pad PAD may be electrically connected to a driving circuit and/or a driving chip through a separate connection member such as a conductive adhesive member.

Hereinafter, in FIGS. 8 to 12, the pixel PXL may be understood as a pixel disposed at an outermost portion of the display area DA (for example, a boundary between the display area DA and the non-display area NDA).

In an embodiment, as shown in FIG. 8, the bank BNK may not be formed at the outermost portion of the pixel PXL. However, this is an example, and the bank BNK as shown in FIG. 6 may also be disposed at the boundary between the display area DA and the non-display area NDA. For example, in FIG. 8, the bank BNK may be disposed under a second dummy pattern DP2.

The dummy pattern DP may be disposed in a form surrounding a side surface of the color conversion layer CCL. The dummy pattern DP may include a first dummy pattern DP1 and the second dummy pattern DP2. In FIG. 8, the first dummy pattern DP1 and the second dummy pattern DP2 are separated, but the first dummy pattern DP1 and the second dummy pattern DP2 may be arbitrarily separated concepts to describe the dummy pattern DP. For example, regarding the dummy pattern DP surrounding the emission area EMA (for example, the color conversion layer CCL) of the pixel PXL, the dummy pattern DP may be divided into the first dummy pattern DP1 and the second dummy pattern DP2 based on the display area DA and the non-display area NDA.

The first dummy pattern DP1 may overlap the non-emission area NEA between the pixel PXL and another pixel adjacent thereto.

The second dummy pattern DP2 may overlap the non-display area NDA. An upper surface of the second dummy pattern DP2 may be positioned at a position lower than the upper surface of the color conversion layer CCL. In an embodiment, the second dummy pattern DP2 may have multiple step differences that are lowered toward an outside of the non-display area NDA (e.g., the multiple step differences may become lower in height toward an outside of the non-display area). Therefore, an abrupt step difference according to a height (thickness) of the color conversion layer CCL may be alleviated. According to an embodiment, the second dummy pattern DP2 may not extend to the pad area PDA.

In an embodiment, the first dummy pattern DP1 and the second dummy pattern DP2 may be formed through the same process. In another embodiment, the step differences of the second dummy pattern DP2 may be formed through an additional process after a process of forming the first dummy pattern DP1.

The capping layer CPL, the dummy bank D_BNK, and the organic layer OL may be sequentially stacked on each other on the dummy pattern DP. In FIG. 8, the dummy bank D_BNK is formed according to an upper surface profile of the dummy pattern DP, but the disclosure is not limited thereto, and the dummy bank D_BNK may have a substantially flat upper surface. In other embodiments, the dummy bank D_BNK may be omitted, and the organic layer OL, which is a planarization layer, may be disposed on the capping layer CPL.

In an embodiment, as shown in FIG. 8, the pad area PDA may include an opening exposing an upper surface of the signal pad PAD. For example, the via layer VIA, the first insulating layer INS1, the fourth insulating layer INS4, the capping layer CPL, the dummy bank D_BNK, and the organic layer OL on the signal pad PAD may be etched (removed).

As described above, the display device DD according to embodiments of the disclosure may include the dummy pattern DP surrounding the side surface of the color conversion layer CCL formed to be higher than the bank BNK. A portion of the dummy pattern DP extending to the non-display area NDA may have a step shape that is lowered toward the outside of the non-display area NDA. Therefore, damage to the color conversion layer CCL, which is generated because the photoresist for the etching process after the formation of the color conversion layer CCL is not coated on a portion of the side surface of the color conversion layer CCL, may be prevented or minimized, thereby improving a defect rate.

Since a thickness of the photoresist may be maintained as thin as about 2.0 μm or less by disposition of the dummy pattern DP, a process deviation, a process time, and a cost may be reduced.

FIGS. 9 to 12 are schematic cross-sectional views illustrating examples of the dummy pattern DP disposed in the non-display area NDA.

In FIGS. 9 to 12, the same reference numerals are used for the same components as the components described with reference to FIG. 6, and redundant description of these components is omitted. For convenience of description, upper configurations of the color conversion layer CCL and the dummy pattern DP are omitted in the drawings.

Referring to FIGS. 3 and 9 to 12, the second dummy pattern DP2 extending to the non-display area NDA may include multiple pattern layers.

In an embodiment, the second dummy pattern DP2 may include a first pattern layer PTL1 and a second pattern layer PTL2. The first pattern layer PTL1 and the second pattern layer PTL2 may be formed by different processes.

According to an embodiment, the first pattern layer PTL1 may be disposed in the non-emission area NEA in the display area DA as the first dummy pattern DP1. For example, the first dummy pattern DP1 may be formed of the same material and through the same process as the first pattern layer PTL1 of the second dummy pattern DP2. However, this is an example, and the first dummy pattern DP1 may be formed in the same process as the second pattern layer PTL2 of the second dummy pattern DP2.

In an embodiment, the second pattern layer PTL2 and the first pattern layer PTL1 may include different materials. For example, the second pattern layer PTL2 and the first pattern layer PTL1 may include different materials from among the above-described inorganic materials and black materials. In another embodiment, the first pattern layer PTL1 and the second pattern layer PTL2 may include substantially the same material.

Figure 9:
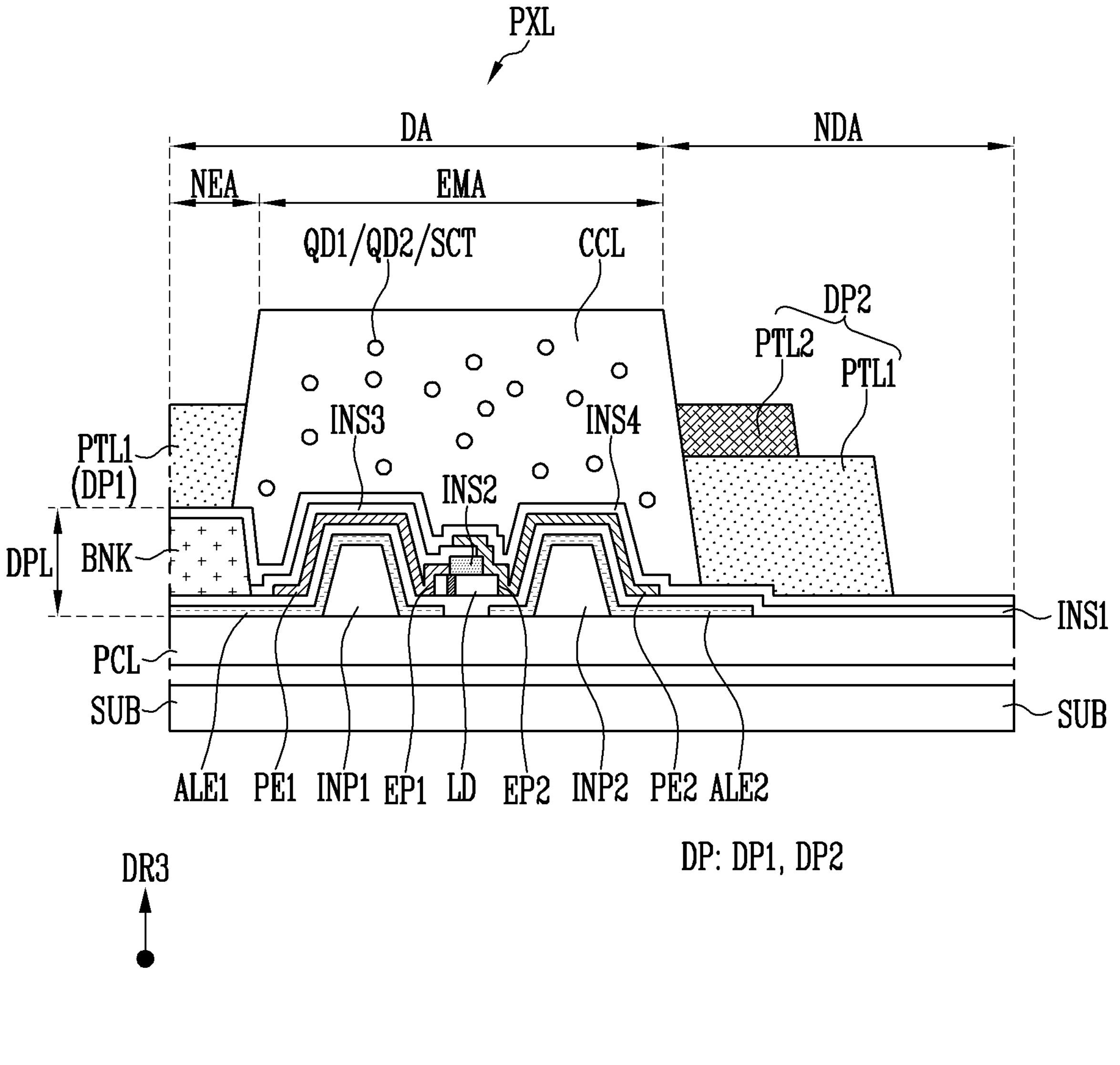
FIGS. 9 to 12 are schematic cross-sectional views illustrating examples of a dummy pattern disposed in a non-display area.
Figure 10:
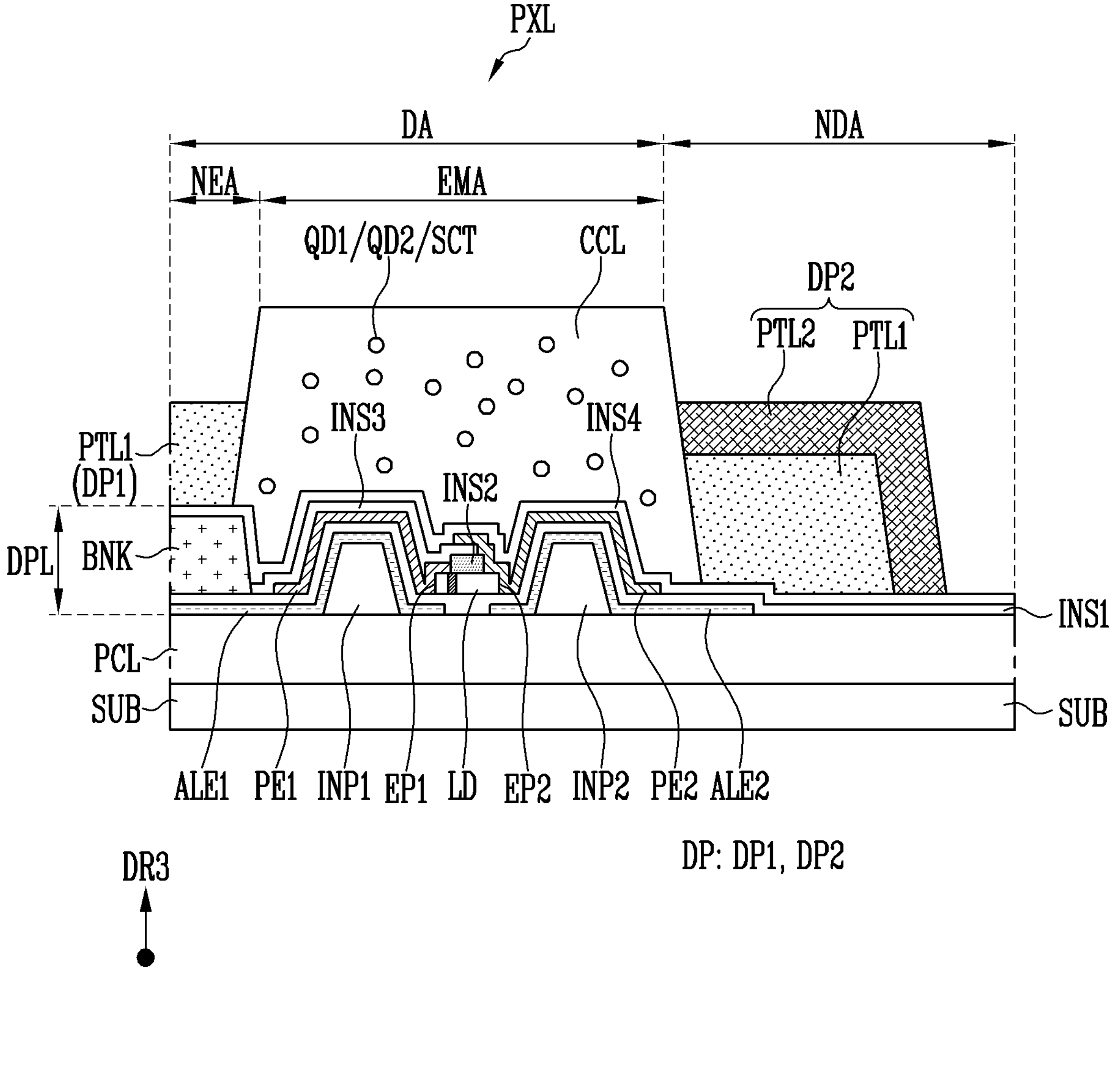
Figure 11:
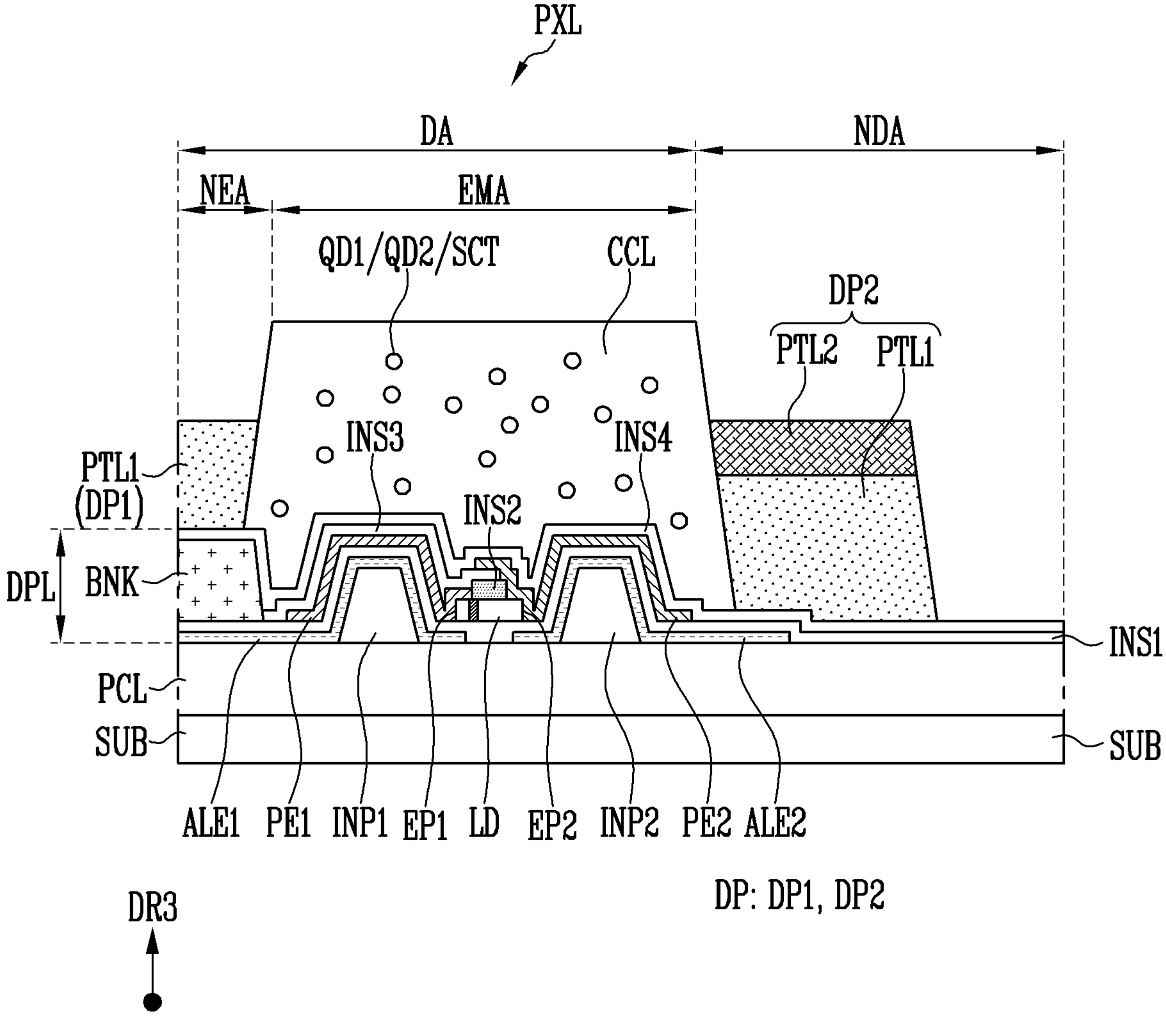

As shown in FIGS. 9, 10, and 11, the second pattern layer PTL2 may be disposed on the first pattern layer PTL1. In an embodiment, as shown in FIG. 9, the second pattern layer PTL2 may cover a portion of an upper surface of the first pattern layer PTL1. Accordingly, a step difference may be formed between the first pattern layer PTL1 and the second pattern layer PTL2.

In an embodiment, as shown in FIG. 10, the second pattern layer PTL2 may cover both of the upper surface and a side surface of the first pattern layer PTL1. Accordingly, a thickness (height) of the second dummy pattern DP2 may be readily secured.

In an embodiment, as shown in FIG. 11, the second pattern layer PTL2 may cover only the entire upper surface of the first pattern layer PTL1 according to a process method. Compared to the embodiment of FIG. 12, the pad area PDA in which the signal pad PD or the like is disposed may be secured wider.

In FIGS. 9 to 11, the second dummy pattern DP2 includes two pattern layers PTL1 and PTL2, but is not limited thereto. For example, the second dummy pattern DP2 may include three or more pattern layers.

Figure 12:
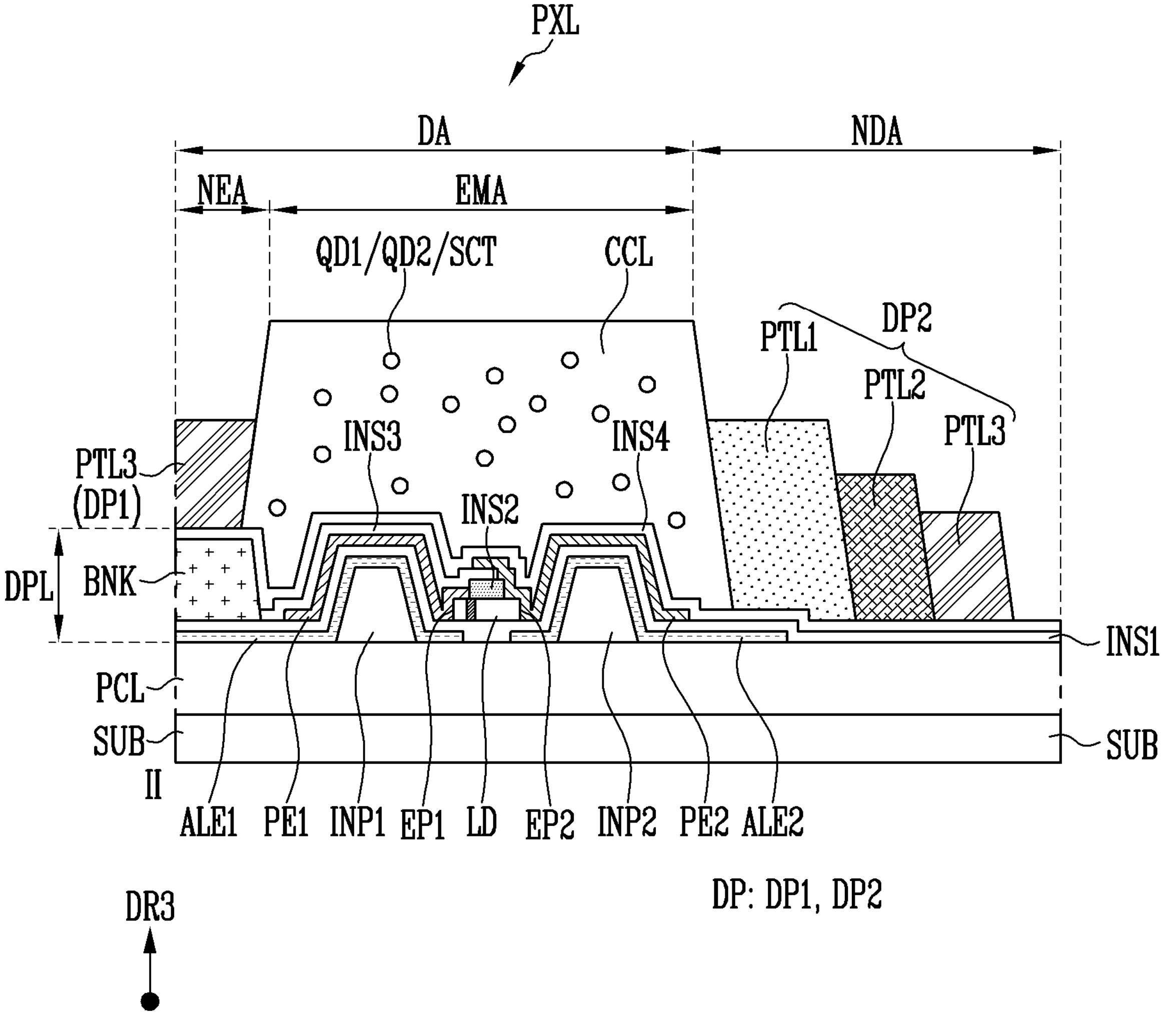

In an embodiment, as shown in FIG. 12, the second dummy pattern DP2 may include a second pattern layer PTL2 that is in contact with a side surface of a first pattern layer PTL1 and a third pattern layer PTL3 that is in contact with a side surface of the second pattern layer PTL2. The second pattern layer PTL2 may surround at least a portion of the side surface of the first pattern layer PTL1, and the third pattern layer PTL3 may surround at least a portion of the side surface of the second pattern layer PTL2.

Upper surfaces of the first pattern layer PTL1, the second pattern layer PTL2, and the third pattern layer PTL3 may have a step difference. For example, the upper surface of the second pattern layer PTL2 may be at a position lower than that of the upper surface of the first pattern layer PTL1, and the upper surface of the third pattern layer PTL3 may be at a position lower than that of the upper surface of the second pattern layer PTL2. Accordingly, the second dummy pattern DP2 may have a step shape that is lowered (decreases) toward the outside of the non-display area NDA.

The first pattern layer PTL1, the second pattern layer PTL2, and the third pattern layer PTL3 may be formed through different deposition or patterning processes.

The first pattern layer PTL1, the second pattern layer PTL2, and the third pattern layer PTL3 may include the same material. However, this is an example, and at least one of the first pattern layer PTL1, the second pattern layer PTL2, and the third pattern layer PTL3 may include a material different from that of other pattern layers.

As shown in FIG. 12, in an embodiment, the first dummy pattern DP1 may be formed of the same material and by the same process as the third pattern layer PTL3. However, this is an example, and the first dummy pattern DP1 may be formed by the same process as the first pattern layer PTL1 or the second pattern layer PTL2, or may include at least two pattern layers among the first pattern layer PTL1, the second pattern layer PTL2, and the third pattern layer PTL3.

Figure 13:
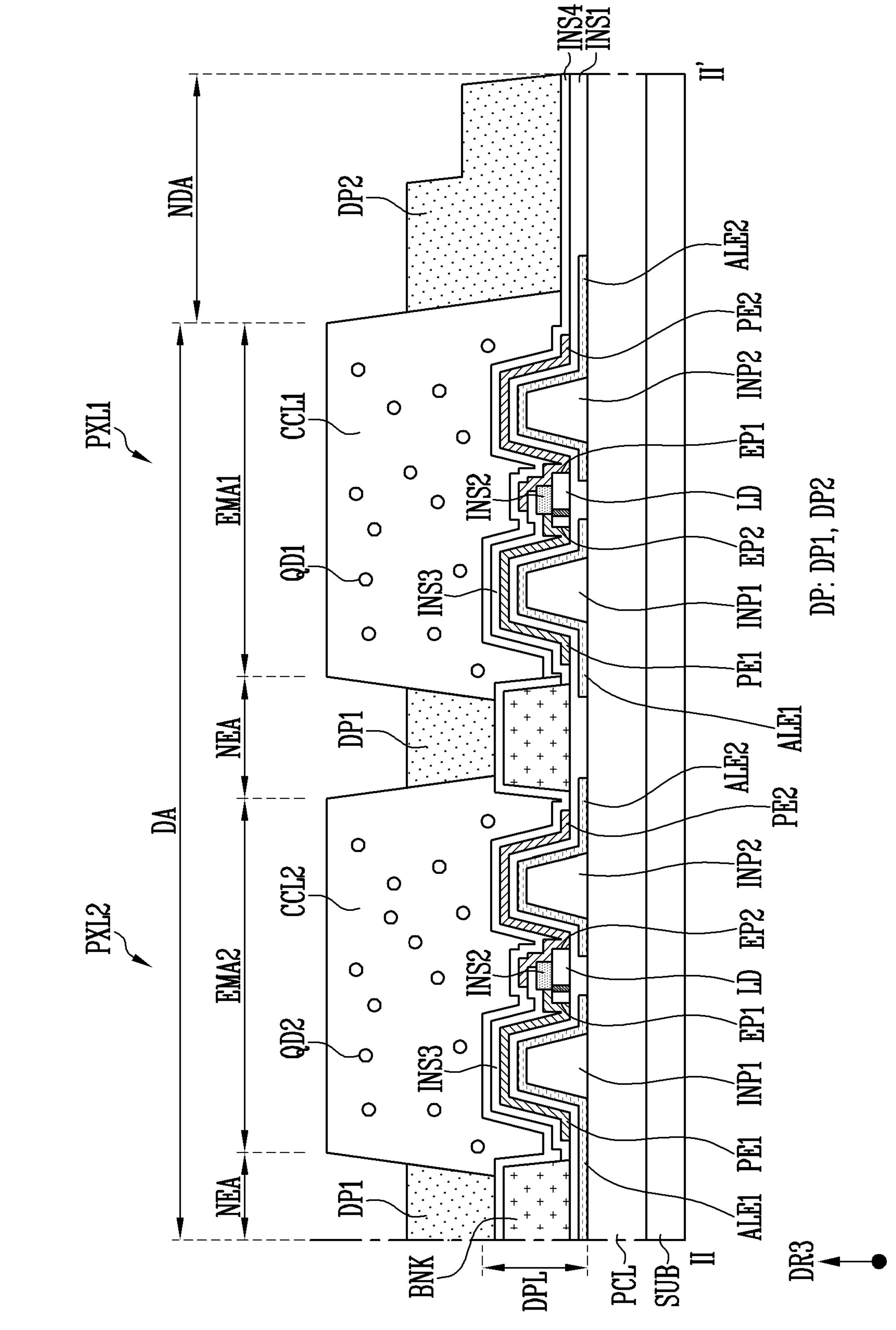
FIG. 13 is a schematic cross-sectional view illustrating an example taken along line II-IF of FIG. 3.

FIG. 13 is a schematic cross-sectional view illustrating an example taken along line II-IF of FIG. 3.

In FIG. 13, the same reference numerals are used for the same components as the components described with reference to FIGS. 6 and 8, and redundant description of these components is omitted. For convenience of description, upper configurations of the color conversion layers CCL1 and CCL2 and the dummy pattern DP are omitted from the drawings.

Referring to FIGS. 3 and 13, a first pixel PXL1 may include a first color conversion layer CCL1 overlapping a first emission area EMA1, and a second pixel PXL2 may include a second color conversion layer CCL2 overlapping a second emission area EMA2. For example, the first pixel PXL1 and the second pixel PXL2 may emit light of different colors.

The first pixel PXL1 may be a pixel disposed at an outermost side of the display area DA, and the second pixel PXL2 may be a pixel adjacent to the first pixel PXL1. For example, the first pixel PXL1 and the second pixel PXL2 may be adjacent to each other in the first direction DR1.

The pixel circuit layer PCL and the display element layer DPL of the first pixel PXL1 and the second pixel PXL2 may have structures substantially identical or similar to each other.

The dummy pattern DP may include a first dummy pattern DP1 overlapping the non-emission area NEA of the display area DA and disposed on the bank BNK, and the second dummy pattern DP2 disposed in the non-display area NDA.

In an embodiment, the second dummy pattern DP2 may have step differences that are lowered toward the outside of the non-display area NDA (for example, in the first direction DR1). The second dummy pattern DP2 may alleviate a step difference between the first color conversion layer CCL1 and a structure (for example, the fourth insulating layer INS4) of the non-display area NDA.

The first dummy pattern DP1 may be disposed between the first color conversion layer CCL1 and the second color conversion layer CCL2, and alleviate a step difference between the color conversion layers CCL1 and CCL2 and the bank BNK.

Figure 14:
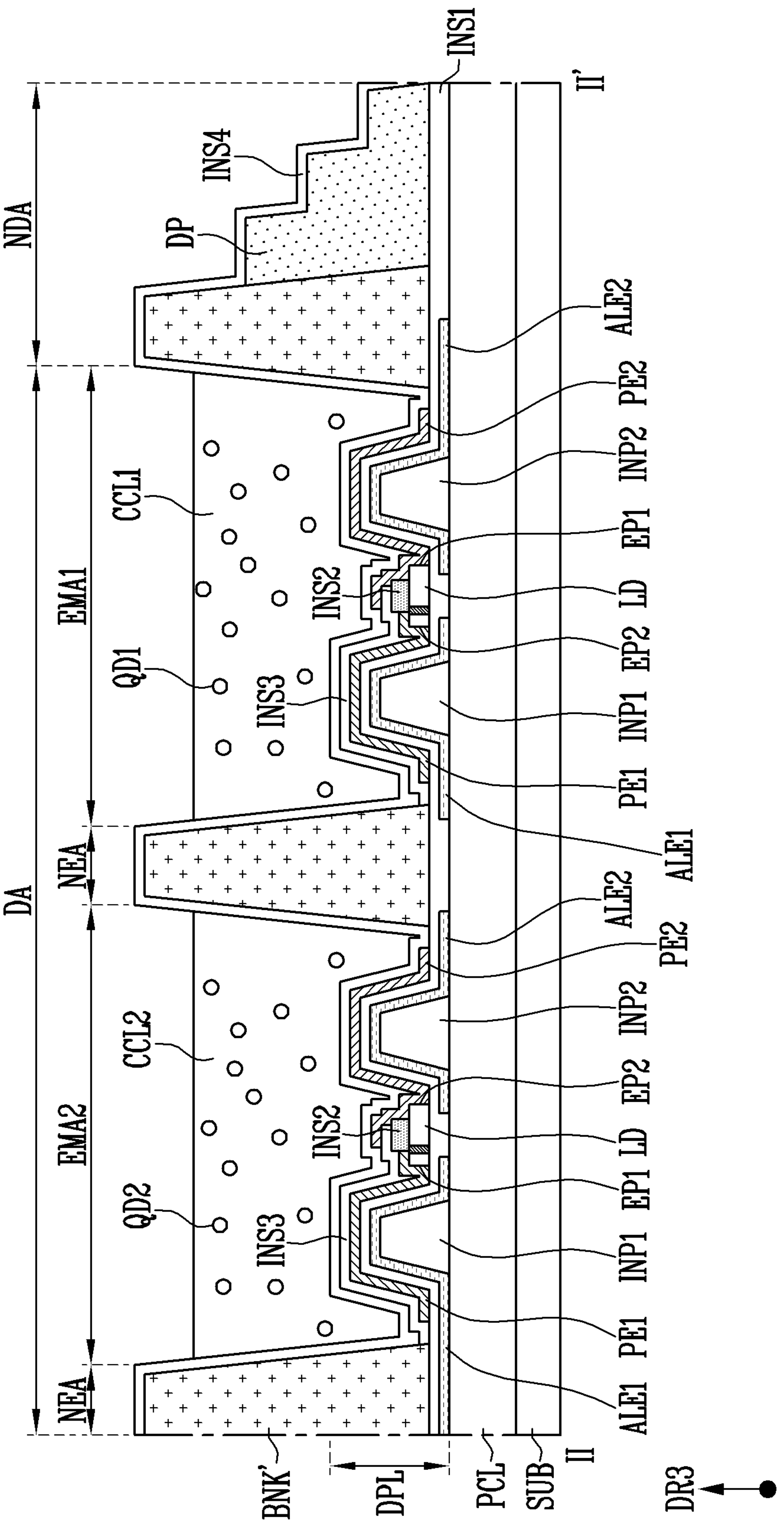
FIG. 14 is a schematic cross-sectional view illustrating an example taken along line II-IF of FIG. 3.

FIG. 14 is a schematic cross-sectional view illustrating an example taken along line II-IF of FIG. 3.

In FIG. 14, the same reference numerals are used for the same components as the components described with reference to FIGS. 6, 8, and 13, and redundant description of these components is omitted. For convenience of description, upper configurations of the color conversion layers CCL1 and CCL2 and the dummy pattern DP are omitted from the drawings.

Referring to FIGS. 3 and 14, the first pixel PXL1 may include the first color conversion layer CCL1 overlapping the first emission area EMA1, and the second pixel PXL2 may include the second color conversion layer CCL2 overlapping the second emission area EMA2.

In an embodiment, the first color conversion layer CCL1 and the second color conversion layer CCL2 may be input (or formed) to the first emission area EMA1 and the second emission area EMA2 through an inkjet process providing color conversion materials corresponding to each of the first color conversion layer CCL1 and the second color conversion layer CCL2. A bank BNK' defining the first emission area EMA1 and the second emission area EMA2 to prevent overflow of the color conversion material into an emission area of an adjacent pixel may be formed to be higher than the first color conversion layer CCL1 and the second color conversion layer CCL2. For example, an upper surface of the bank BNK' may be positioned higher than an upper surface of the first color conversion layer CCL1 and an upper surface of the second color conversion layer CCL2.

In an embodiment, the dummy pattern DP may be disposed outside the bank BNK' formed at a boundary between the display area DA and the non-display area NDA outside the first pixel PXL1 disposed at the outermost side of the display area DA. The dummy pattern DP may alleviate a step difference between the bank BNK' and a lower structure of the non-display area NDA. For example, the dummy pattern DP may be disposed in the non-display area NDA, and may include step differences that are lowered toward the outside of the non-display area NDA.

In an embodiment, the fourth insulating layer INS4 may be formed before the first color conversion layer CCL1 and the second color conversion layer CCL2 are provided, and may integrally cover the bank BNK' and the dummy pattern DP. However, this is an example, and the dummy pattern DP may be formed after the bank BNK' and the fourth insulating layer INS4 are formed. The dummy pattern DP may be disposed on (e.g., directly disposed on) the fourth insulating layer INS4.

FIGS. 15 to 24 are schematic cross-sectional views illustrating a method of manufacturing a display device DD according to embodiments of the disclosure.

In FIGS. 15 to 24, only two pixels PXL1 and PXL2 adjacent to each other at the outermost side of the display area DA are shown for convenience of description. However, this is an example, and the display device DD may further include at least one pixel emitting a color different from that of the first and second pixels PXL1 and PXL2.

Referring to FIGS. 15 to 24, the method of manufacturing the display device may include forming the first and second color conversion layers CCL1 and CCL2 including the bank BNK and the light emitting elements LD, forming the dummy pattern DP in the non-display area NDA and the non-emission area NEA, integrally forming the photoresist PR on the first and second color conversion layers CCL1 and CCL2 and dummy pattern DP, patterning a lower configuration of the photoresist PR, removing the remaining photoresist PR, and forming the dummy bank D_BNK, a planarization layer OP, and the color filter layer CFL.

In FIGS. 15 to 24, a configuration of the pixel circuit layer PCL and the display element layer DPL is omitted or briefly shown for convenience of description. For example, the pixel circuit layer PCL may include the signal pad PAD disposed in the non-display area NDA and the via layer VIA covering the signal pad PAD, and the display element layer DPL may include the light emitting elements LD disposed in the emission areas EMA1 and EMA2 and the bank BNK dividing the emission areas EMA1 and EMA2 and the non-emission area NEA.

Figure 15:
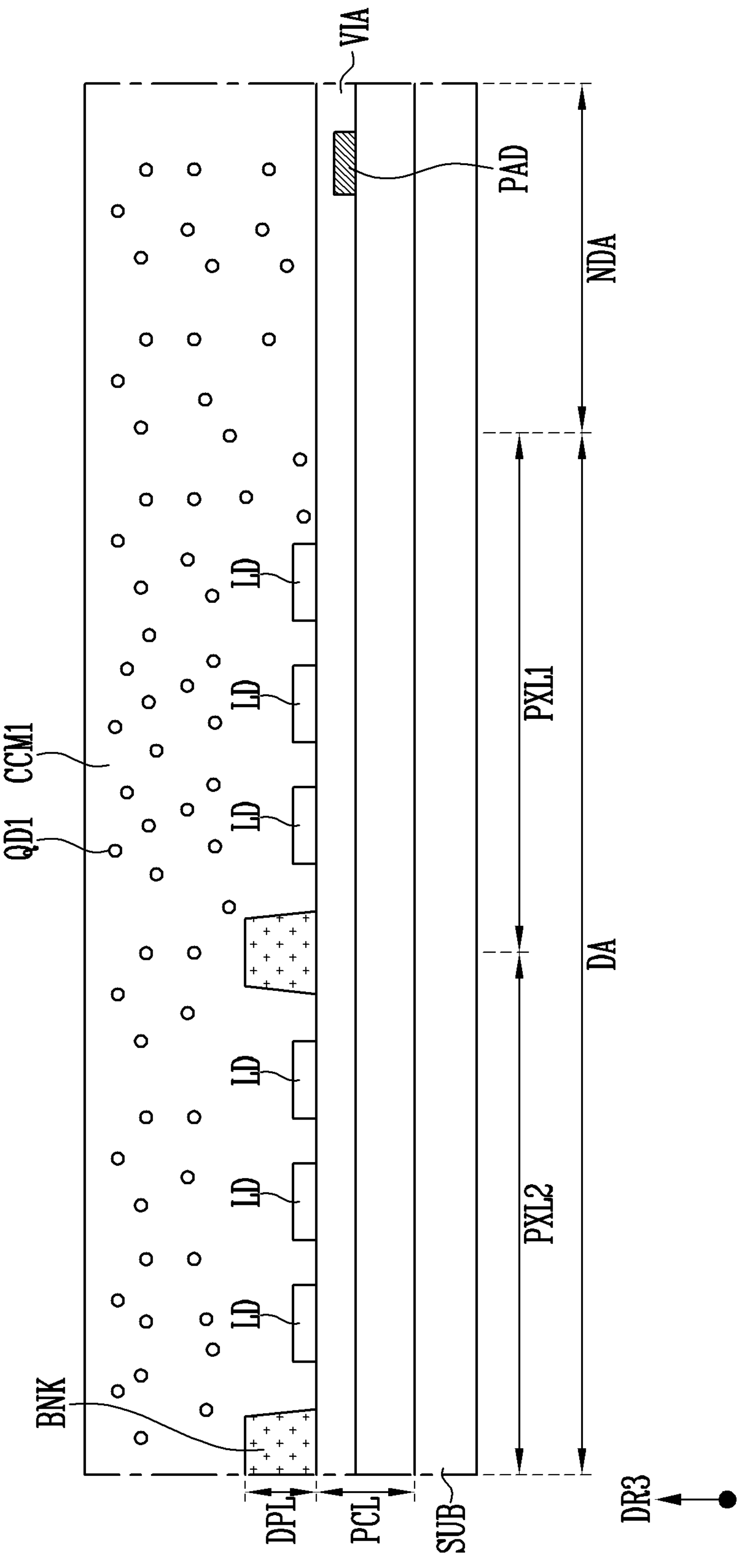
FIGS. 15 to 24 are schematic cross-sectional views illustrating a method of manufacturing a display device according to embodiments of the disclosure.

As shown in FIG. 15, a first color conversion material CCM1 may be coated on the display area DA and the non-display area NDA in which the display element layer DPL is formed. The first color conversion material CCM1 may be formed on the display element layer DPL by various coating processes.

The first color conversion material CCM1 may include the first color conversion particle QD1 that converts light of a first color emitted from the light emitting element LD into light of a second color.

Figure 16:
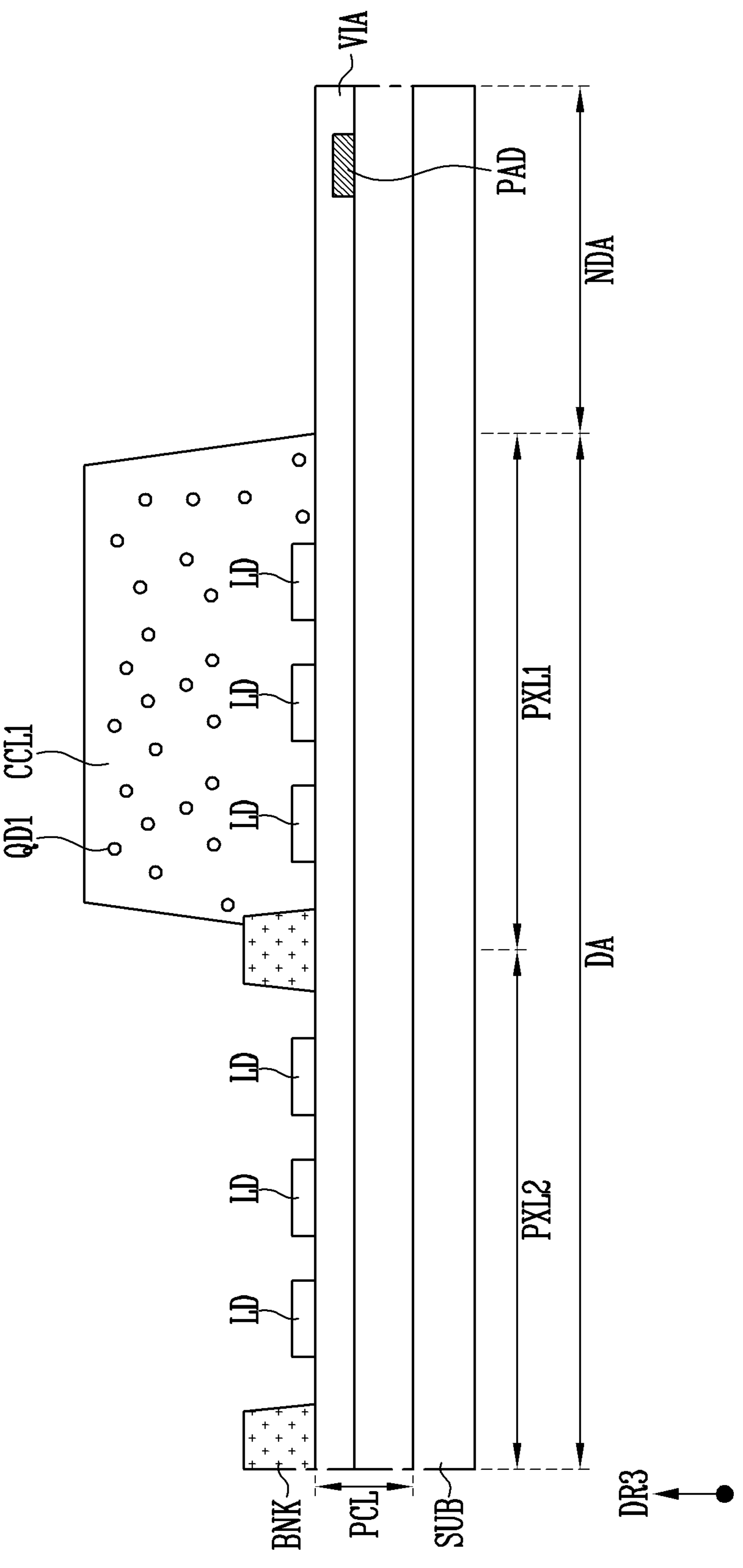

Thereafter, as shown in FIG. 16, the first color conversion material CCM1 of a portion of the first pixel PXL1 except for the first emission area EMA1 may be removed using a mask, and the first color conversion layer CCL1 may be formed by thermally curing the first color conversion material CCM1 remaining in the first emission area EMA1. A portion of the first color conversion layer CCL1 may be disposed on the bank BNK. A thickness of the first color conversion layer CCL1 may be about 4 μm or more. For example, the thickness of the first color conversion layer CCL1 may be about 10 μm.

Figure 17:
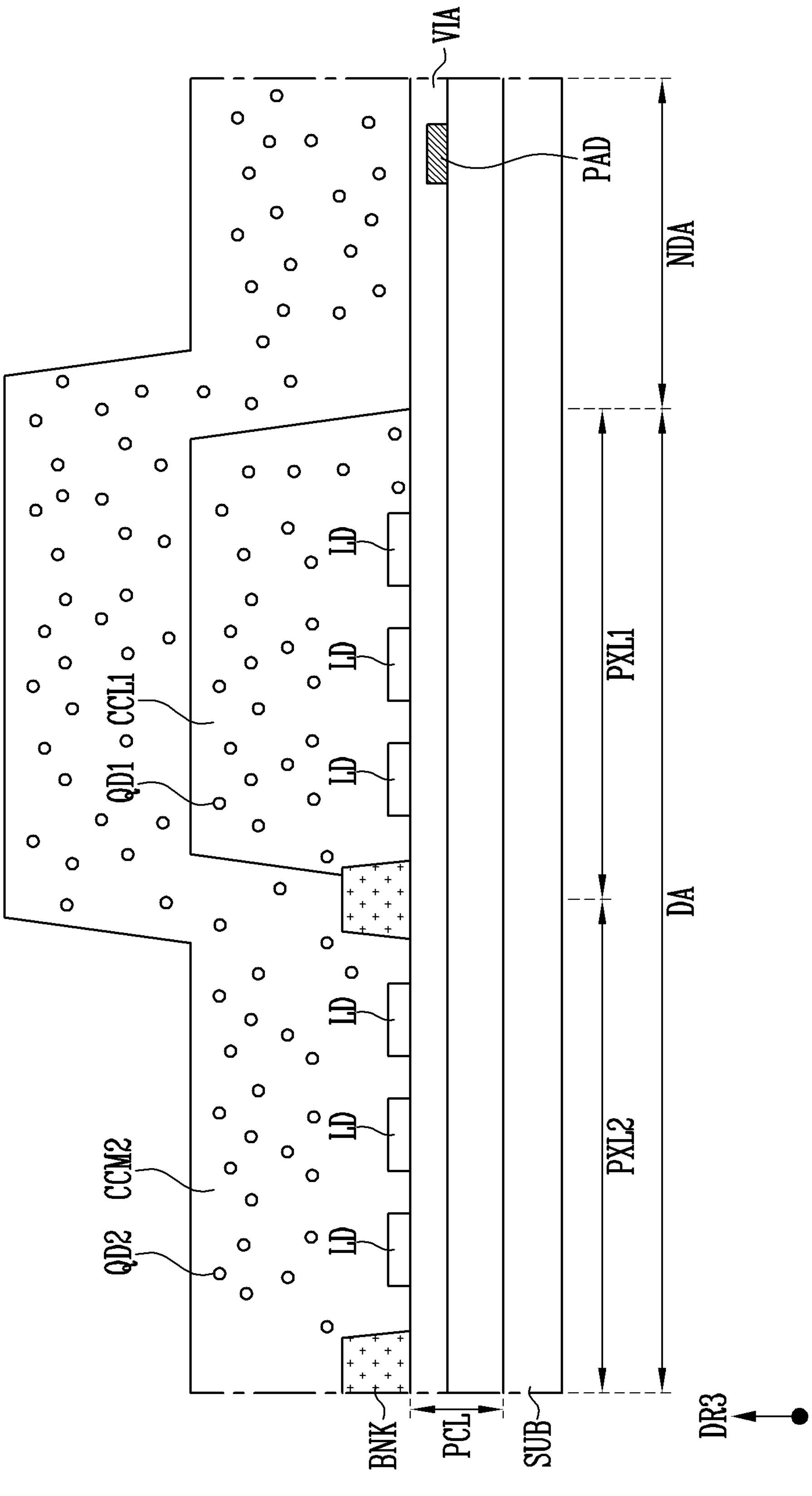

Thereafter, as shown in FIG. 17, a second color conversion material CCM2 may be coated on the display area DA and the non-display area NDA. The second color conversion material CCM2 may be provided by various coating processes. The second color conversion material CCM2 may cover the first color conversion layer CCL1.

The second color conversion material CCM2 may include the second color conversion particle QD2 that converts the light of the first color emitted from the light emitting element LD into light of a third color.

Figure 18:
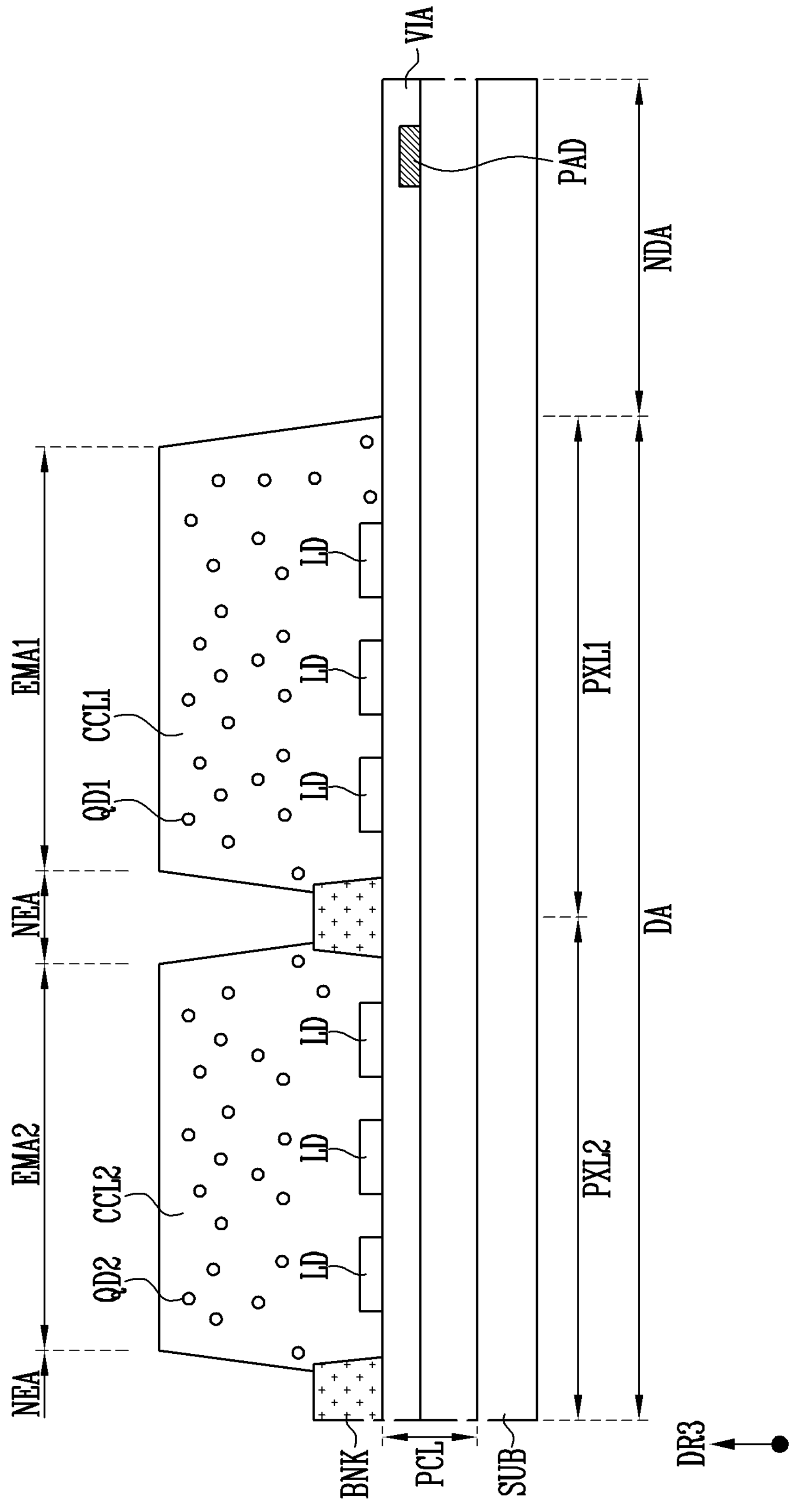

Thereafter, as shown in FIG. 18, the second color conversion material CCM2 of a portion of the second pixel PXL2 except for the second emission area EMA2 may be removed using a mask, and the second color conversion layer CCL2 may be formed by thermally curing the second color conversion material CCM2 remaining in the second emission area EMA2. The second color conversion layer CCL2 may not overlap the first color conversion layer CCL1. A thickness (height) of the second color conversion layer CCL2 may be similar to the thickness of the first color conversion layer CCL1.

Figure 19:
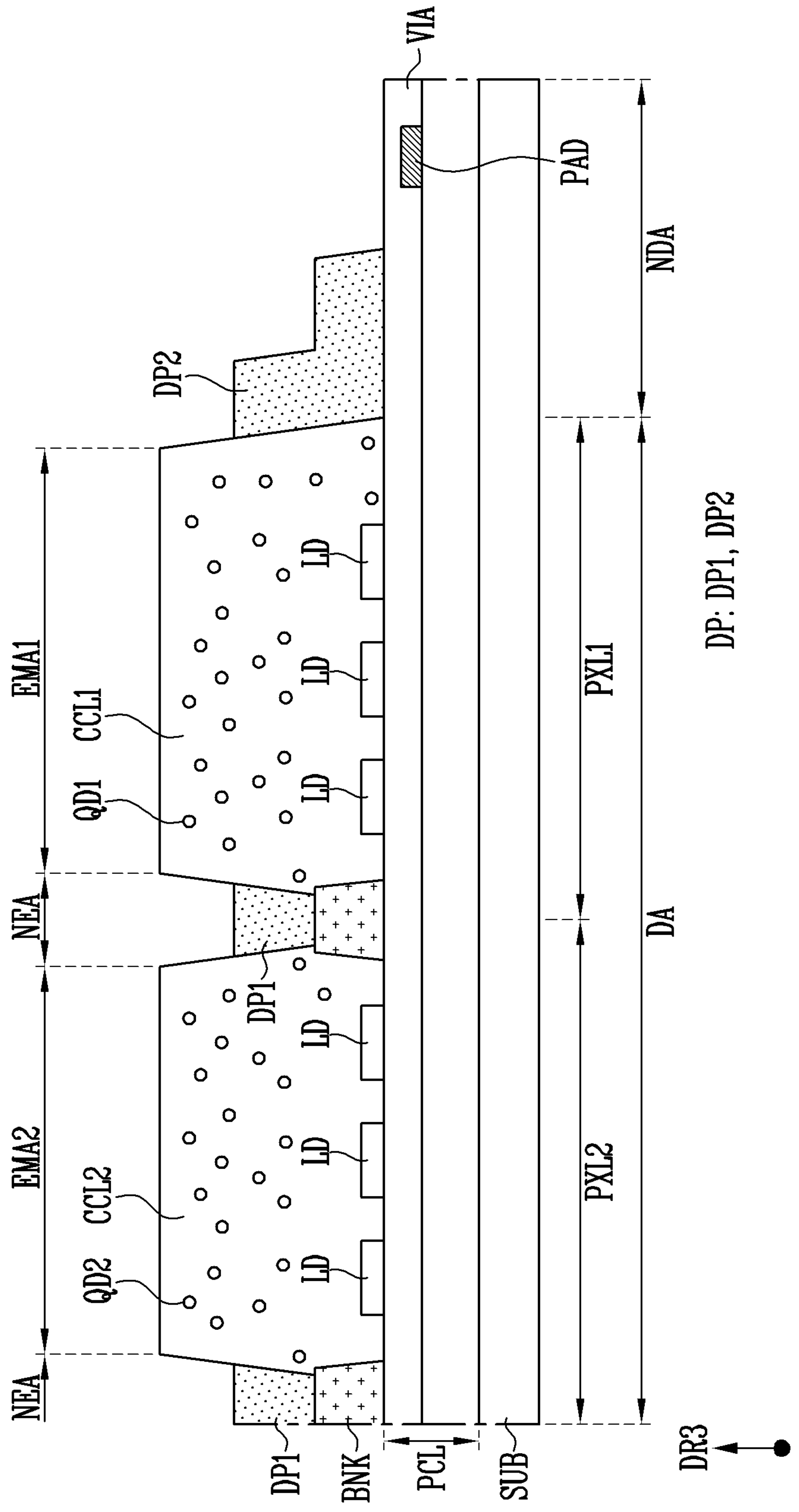

Thereafter, as shown in FIG. 19, the dummy pattern DP may be formed in the non-emission area NEA and in the non-display area NDA extending from the first pixel PXL1. The dummy pattern DP may include the first dummy pattern DP1 formed in the non-emission area NEA of the display area DA and the second dummy pattern DP2 formed in the non-display area NDA.

The dummy pattern DP of an inorganic material may be formed through a chemical vapor deposition method or the like. The dummy pattern DP of an organic material such as a black matrix may be formed through patterning process (for example, a photoresist process) through a mask and exposure after coating the organic material.

In an embodiment, the second dummy pattern DP2 may be formed after the first dummy pattern DP1 is formed, or the first dummy pattern DP1 may be formed after the second dummy pattern DP2 is formed.

In an embodiment, the second dummy pattern DP2 may be formed through multiple patterning and/or deposition processes to have a step shape. The first dummy pattern DP1 may be formed through a partial process among processes of forming the second dummy pattern DP2.

In an embodiment, the first dummy pattern DP1 and the second dummy pattern DP2 may be formed of the same material by the same process.

Figure 20:
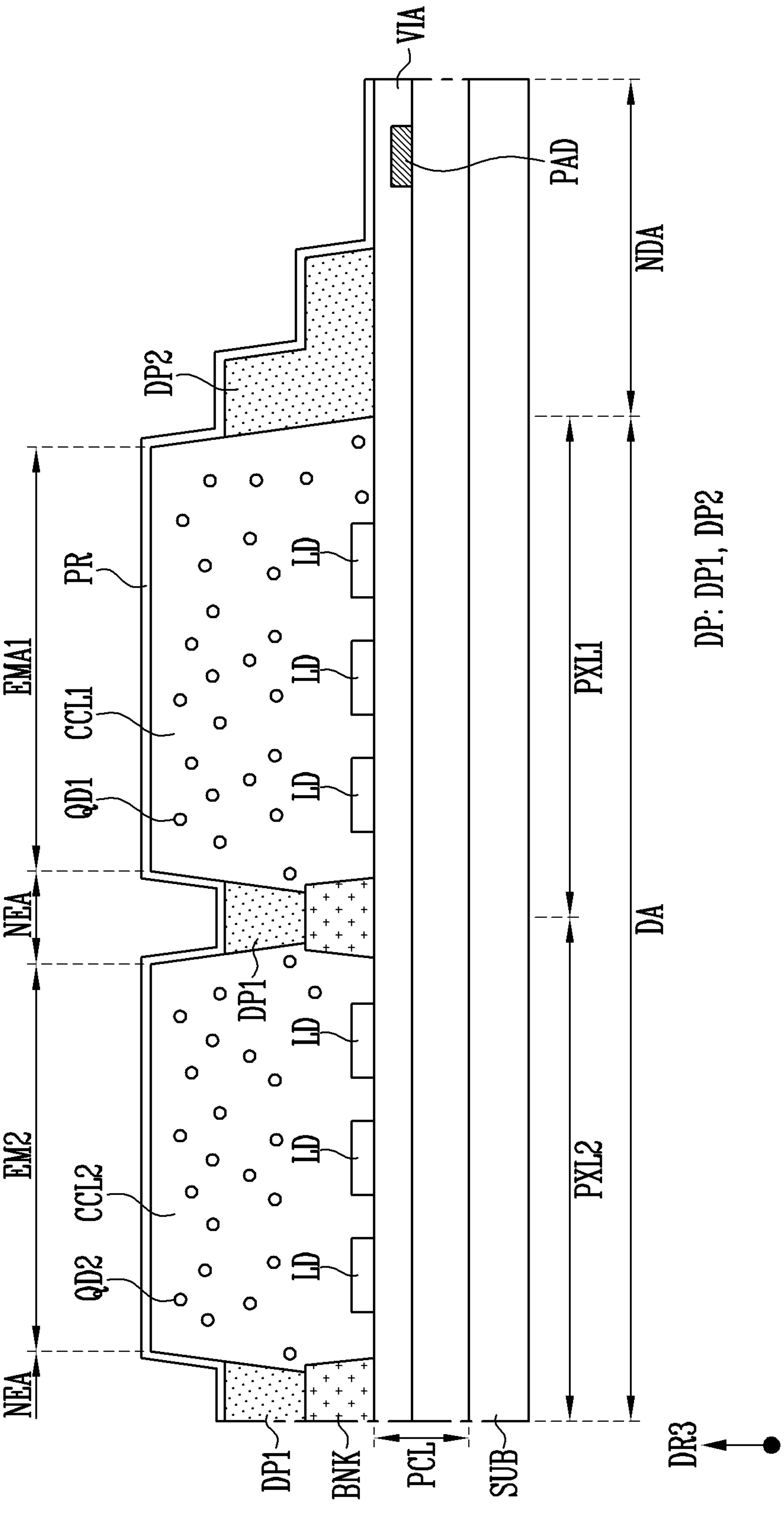

Thereafter, as shown in FIG. 20, the photoresist PR may be integrally formed on the display device DD including the entire surface of the dummy pattern DP, the first color conversion layer CCL1, and the second color conversion layer CCL2. The photoresist PR may be applied with an even thickness through various deposition methods.

A step difference between the color conversion layers CCL1 and CCL2 and an area adjacent thereto may be alleviated (lowered) by the dummy pattern DP. Therefore, the photoresist PR with a thin thickness of about 2 μm or less may be formed in the display area DA and the non-display area NDA with a relatively even thickness.

Figure 21:
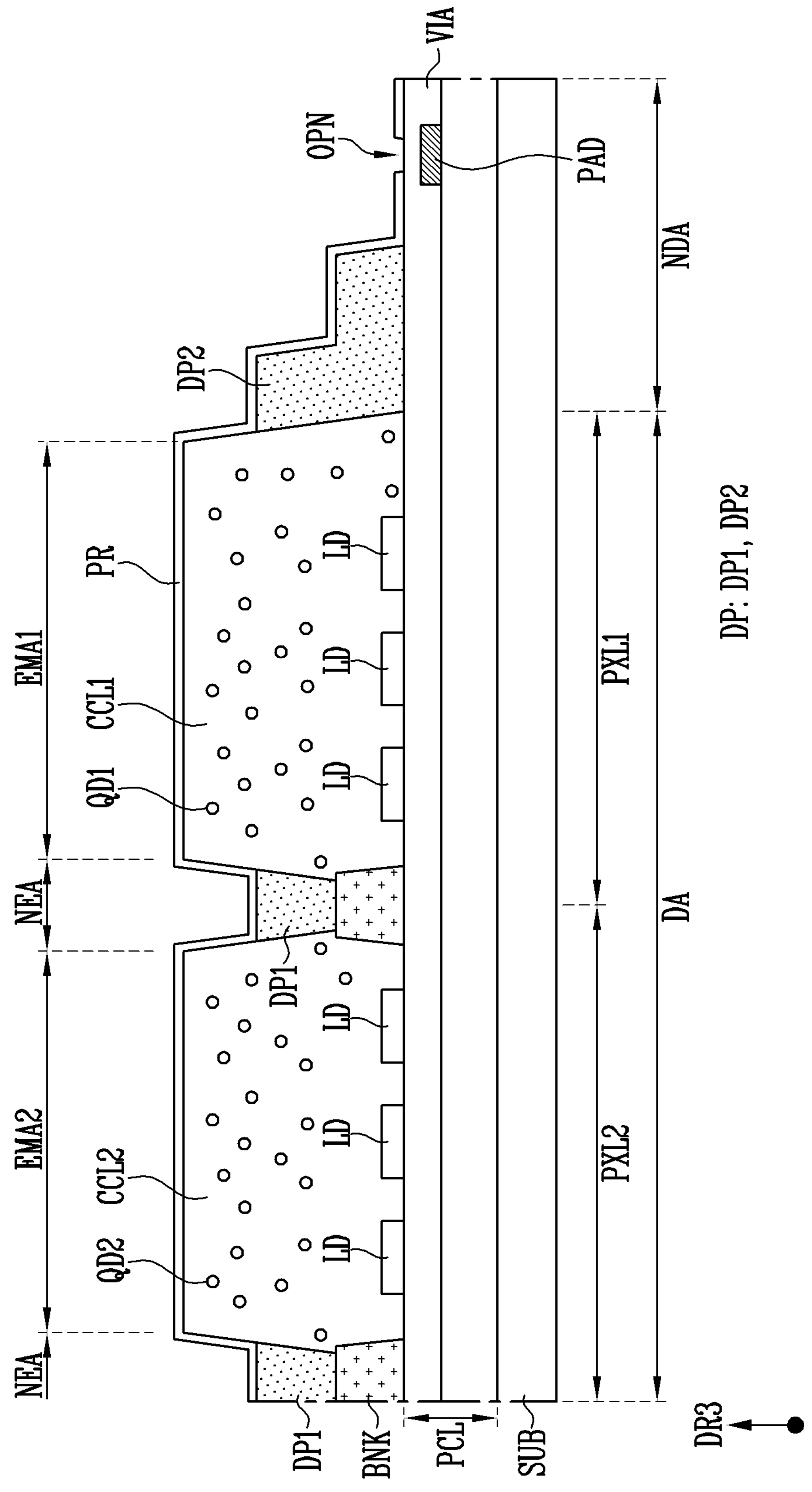

Thereafter, as shown in FIG. 21, an opening OPN of the photoresist PR may be formed by patterning the photoresist PR using a mask. For example, the opening OPN may overlap the signal pad PAD. However, this is an example, and the opening OPN of the photoresist PR may be formed at various positions as needed.

Figure 22:
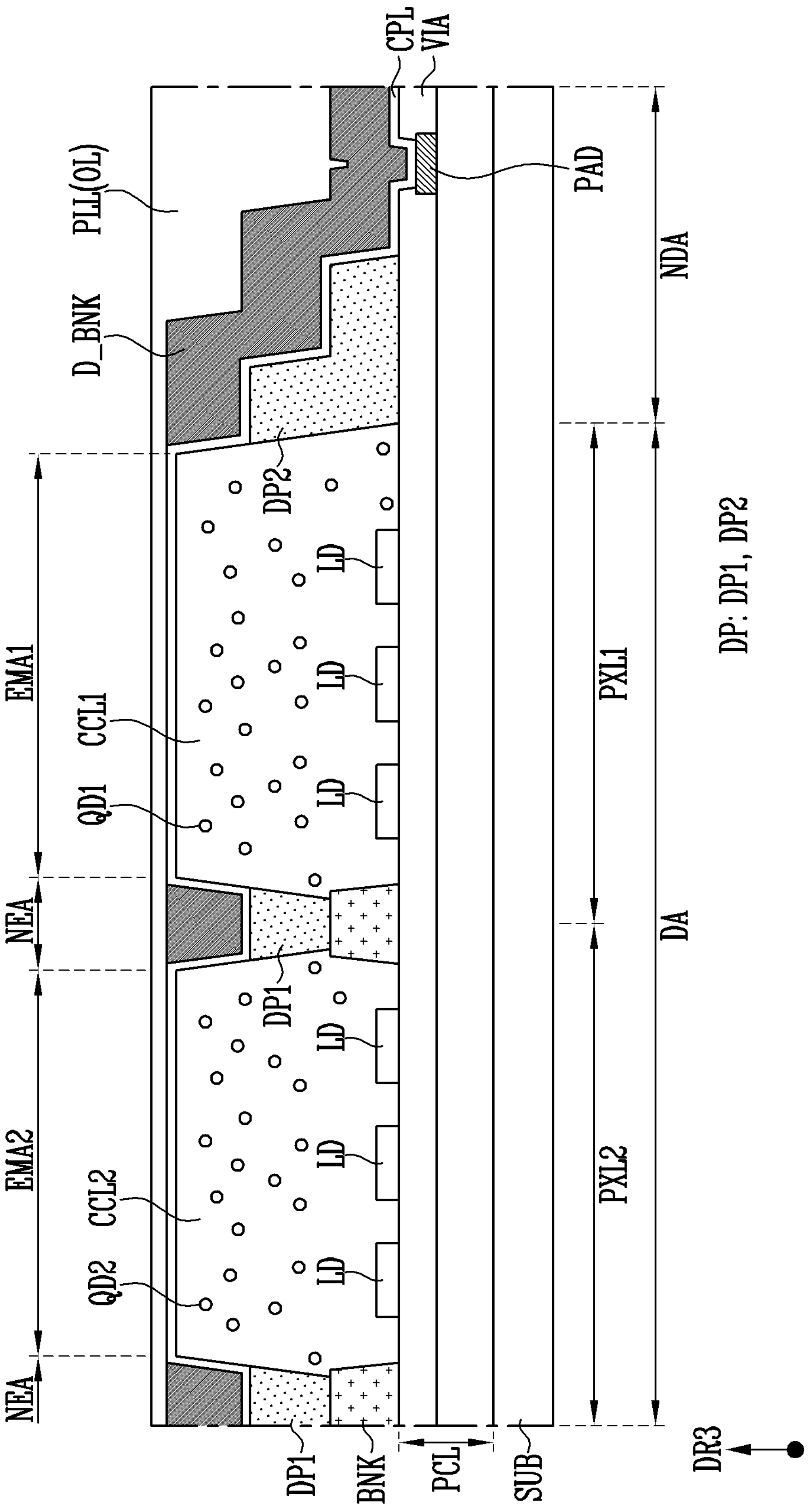

Thereafter, as shown in FIGS. 21 and 22, a lower configuration exposed from the photoresist PR may be etched, and thus the signal pad PAD may be exposed from the via layer VIA. All remaining photoresist PR may be removed through a strip process.

In an embodiment, the capping layer CPL may be integrally formed in the display area DA and the non-display area NDA from which all photoresist PR is removed. The capping layer CPL may be formed by various coating processes. The capping layer CPL may cover the dummy pattern DP and the color conversion layers CCL1 and CCL2.

In an embodiment, the dummy bank D_BNK may be formed on the capping layer CPL. For example, the dummy bank D_BNK may be formed in the non-display area NDA and the non-emission area NEA of the display area DA. The dummy bank D_BNK of an inorganic material may be formed through a chemical vapor deposition method or the like. The dummy bank D_BNK of an organic material may be formed through patterning process through a mask and exposure after coating the organic material.

In an embodiment, the planarization layer PLL, which is the organic layer OL, may be integrally formed on the dummy bank D_BNK and the capping layer CPL. The planarization layer PLL may be formed by various coating methods, and may provide a flat surface thereon.

Figure 23:
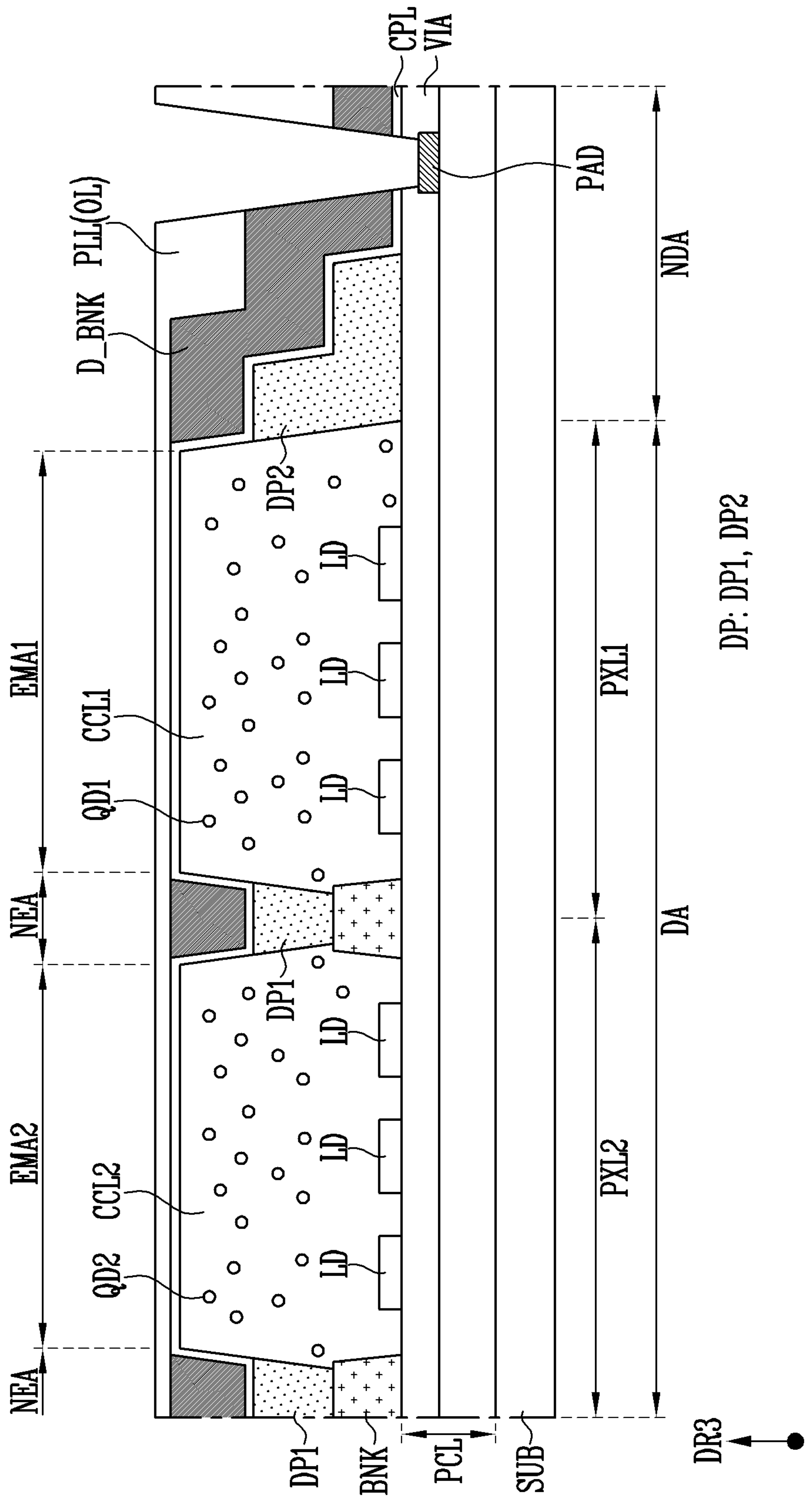

Thereafter, as shown in FIG. 23, the capping layer CPL, the dummy bank D_BNK, and the planarization layer PLL may be removed so that the signal pad PAD is exposed. The capping layer CPL, the dummy bank D_BNK, and the planarization layer PLL may be removed by an etching process or the like.

Figure 24:
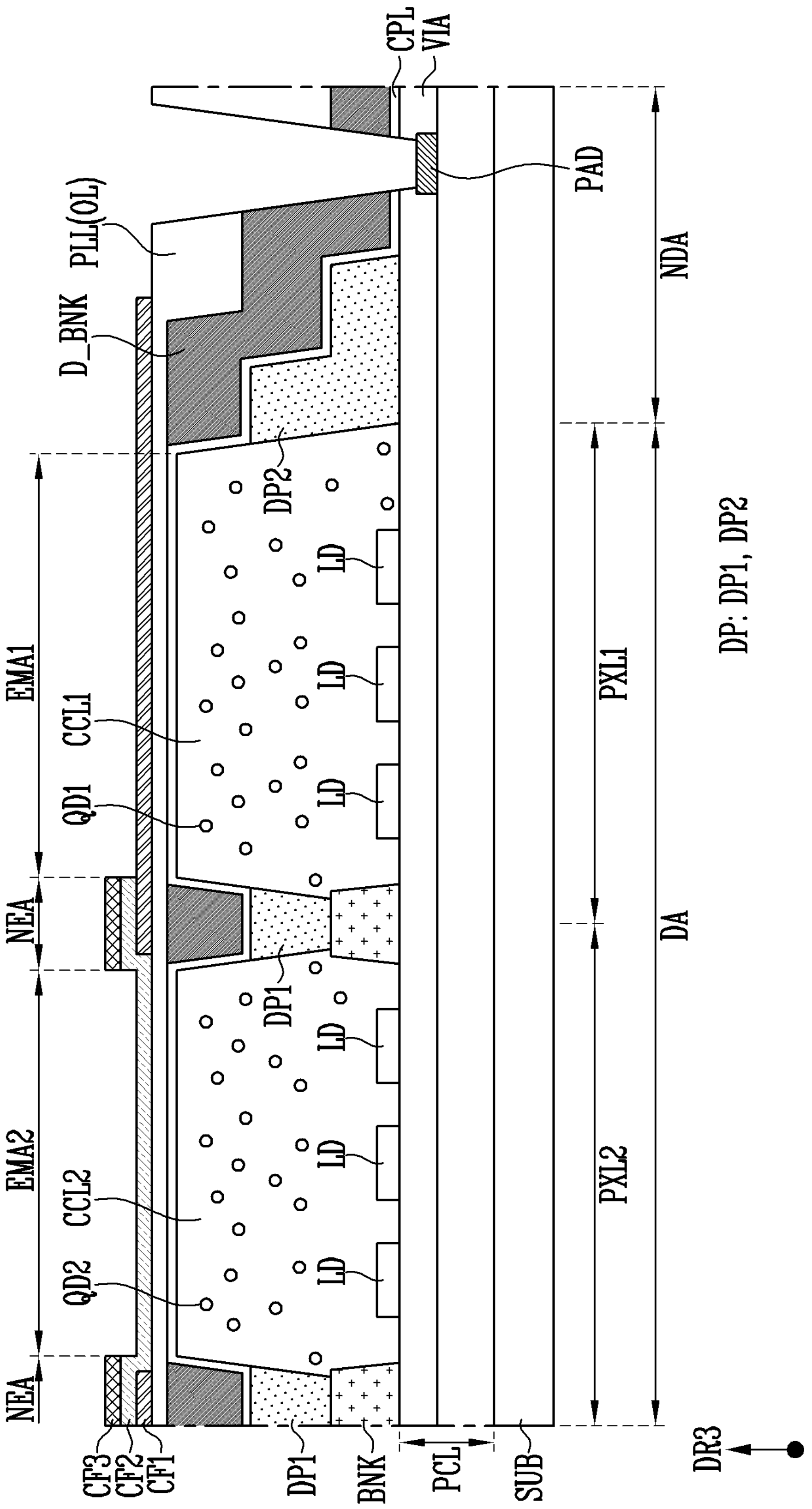

Thereafter, as shown in FIG. 24, the color filter layer CFL (see FIG. 6) may be formed on the planarization layer PLL of the display area DA. After the first color filter CF1 is patterned to be disposed in the first emission area EMA1 and the non-emission area EMA, the second color filter CF2 may be patterned to be disposed in the second emission area EMA2 and the non-emission area NEA. Thereafter, the third color filter CF3 may be patterned to be disposed in the emission area and the non-emission area NEA of a pixel (for example, the third pixel) corresponding to the color of the third color filter CF3.

The first color filter CF1 may overlap the first color conversion layer CCL1, and the second color filter CF2 may overlap the second color conversion layer CCL2.

According to an embodiment, various types of optical layers may be further disposed between the planarization layer PLL and the color filter layer CFL and/or on the color filter layer CFL. For example, the optical layer may include a polarizing layer, an anti-reflection layer, and the like.

As described above, in a method of manufacturing a display device according to embodiments of the disclosure, a dummy pattern DP surrounding a side surface of color conversion layers CCL1 and CCL2 formed higher than a bank BNK may be formed. Therefore, damage to the color conversion layers CCL1 and CCL2, which is generated because the photoresist PR for the etching process after the formation of the color conversion layer is not coated on a portion of the side surface of the color conversion layers CCL1 and CCL2, may be prevented or minimized, thereby improving (decreasing) the defect rate.

Since the thickness of the photoresist may be maintained as thin as about 2.0 μm or less by the disposition of the dummy pattern DP, a process deviation, a process time, and a cost may be reduced.

Although the disclosure has been described with reference to the embodiments thereof, those skilled in the art will understand that the disclosure may be variously modified and changed without departing from the spirit and scope of the disclosure.

What is claimed is:

1. A display device comprising:

a substrate including a display area and a non-display area;

a first pixel disposed at an outermost side of the display area of the substrate;

a dummy pattern extending from the first pixel to the non-display area;

a signal pad disposed outside the dummy pattern and electrically connected to the first pixel, wherein the dummy pattern has a plurality of step differences, and the plurality of step differences become lower in height toward an outside of the non-display area, and wherein the first pixel comprises:

a pixel circuit layer including a transistor disposed on the substrate;

a display element layer disposed on the pixel circuit layer and including light emitting elements; and a first color conversion layer disposed on the display element layer, the dummy pattern is disposed on the pixel circuit layer in the non-display area adjacent to the first color conversion layer, and an upper surface of the dummy pattern is lower than an upper surface of the first color conversion layer.

2. The display device according to claim 1, wherein the dummy pattern includes an inorganic insulating material.

3. The display device according to claim 1, wherein the dummy pattern includes a black material having a light blocking property.

4. The display device according to claim 1, wherein the dummy pattern comprises:

a first pattern layer disposed in the non-display area; and a second pattern layer disposed on at least a portion of an upper surface of the first pattern layer.

5. The display device according to claim 1, wherein the dummy pattern comprises:

a first pattern layer disposed in the non-display area; and a second pattern layer that is in physical contact with a side surface of the first pattern layer, and an upper surface of the first pattern layer has a step difference from an upper surface of the second pattern layer.

6. A display device comprising:

a substrate including a display area and a non-display area;

a first pixel disposed at an outermost side of the display area of the substrate;

a dummy pattern extending from the first pixel to the non-display area;

a signal pad disposed outside the dummy pattern and electrically connected to the first pixel;

a second pixel adjacent to the first pixel and including a pixel circuit layer, a display element layer, and a second color conversion layer on the display element layer; and a bank disposed between the first pixel and the second pixel, wherein the first pixel comprises:

the pixel circuit layer including a transistor disposed on the substrate;

the display element layer disposed on the pixel circuit layer and including light emitting elements; and a first color conversion layer disposed on the display element layer, the dummy pattern is disposed on the pixel circuit layer in the non-display area adjacent to the first color conversion layer, and an upper surface of the dummy pattern is lower than an upper surface of the first color conversion layer.

7. The display device according to claim 6, wherein the dummy pattern is further disposed on the bank between the first pixel and the second pixel.

8. The display device according to claim 7, wherein an upper surface of the bank is lower than the upper surface of the first color conversion layer and an upper surface of the second color conversion layer.

9. The display device according to claim 6, wherein an upper surface of the bank is higher than the upper surface of the first color conversion layer and an upper surface of the second color conversion layer, the dummy pattern has a plurality of step differences, and the plurality of step differences become lower in height toward an outside of the non-display area.

10. The display device according to claim 6, further comprising:

a capping layer integrally disposed on the first color conversion layer, the second color conversion layer, and the dummy pattern;

a dummy bank overlapping the dummy pattern and disposed on the capping layer;

a planarization layer integrally disposed on the capping layer and the dummy bank;

a first color filter disposed on the planarization layer and overlapping the first color conversion layer; and a second color filter disposed on the planarization layer and overlapping the second color conversion layer.

11. The display device according to claim 6, wherein each of the first pixel and the second pixel comprises:

a first pixel electrode electrically connected to first ends of the light emitting elements; and a second pixel electrode electrically connected to second ends of the light emitting elements.

* * * * *